(12) United States Patent
Howald et al.

(10) Patent No.: US 10,469,108 B2
(45) Date of Patent: Nov. 5, 2019

(54) SYSTEMS AND METHODS FOR USING COMPUTER-GENERATED MODELS TO REDUCE REFLECTED POWER TOWARDS A HIGH FREQUENCY RF GENERATOR DURING A CYCLE OF OPERATIONS OF A LOW FREQUENCY RF GENERATOR

(71) Applicant: Lam Research Corporation, Fremont, CA (US)

(72) Inventors: Arthur M. Howald, Livermore, CA (US); John C. Valcore, Jr., Fremont, CA (US); Andrew Fong, Pleasanton, CA (US); David Hopkins, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 415 days.

(21) Appl. No.: 15/098,912

(22) Filed: Apr. 14, 2016

(65) Prior Publication Data

US 2016/0308560 A1    Oct. 20, 2016

Related U.S. Application Data

(63) Continuation-in-part of application No. 14/245,803, filed on Apr. 4, 2014, now Pat. No. 9,779,196, and a continuation-in-part of application No. 15/098,566, filed on Apr. 14, 2016, now Pat. No. 10,276,350, which is a continuation-in-part of application No. 15/098,189, filed on Apr. 13, 2016, now Pat. No. 9,711,332, application No. 15/098,912, which is a continuation of application No. 15/061,705, filed on Mar. 4, 2016, now Pat. No. 10,296,676.

(60) Provisional application No. 61/821,523, filed on May 9, 2013.

(51) Int. Cl.
| | |
|---|---|
| *G01R 19/00* | (2006.01) |
| *H04B 1/04* | (2006.01) |
| *G05B 17/02* | (2006.01) |
| *G06F 17/50* | (2006.01) |

(52) U.S. Cl.
CPC ........... *H04B 1/0475* (2013.01); *G05B 17/02* (2013.01); *G06F 17/5063* (2013.01); *H04B 2001/0491* (2013.01)

(58) Field of Classification Search
CPC .... H04B 1/0475; G05B 17/02; G06F 17/5063
USPC .......................................................... 702/64
See application file for complete search history.

(56) References Cited

U.S. PATENT DOCUMENTS

| | | |
|---|---|---|
| 5,187,454 A | 2/1993 | Collins et al. |
| 6,259,334 B1 | 7/2001 | Howald |
| 2004/0027069 A1* | 2/2004 | Kim ................... H05K 7/20963 313/582 |

(Continued)

*Primary Examiner* — Caleb E Henry
(74) *Attorney, Agent, or Firm* — Penilla IP, APC

(57) ABSTRACT

Systems and methods for reducing reflected towards a higher frequency radio frequency (RF) generator during a period of a lower frequency RF generator and for using a relationship to reduce reflected power are described. By tuning the higher frequency RF generator during the period of the lower frequency RF generator, precise control of the higher frequency RF generator is achieved for reducing power reflected towards the higher frequency RF generator. Moreover, by using the relationship to reduce the reflected power, time is saved during processing of a wafer.

18 Claims, 13 Drawing Sheets

(56) References Cited

U.S. PATENT DOCUMENTS

| | | | |
|---|---|---|---|
| 2005/0029954 A1* | 2/2005 | Yokoshima | H01J 37/32192 315/111.21 |
| 2010/0133974 A1* | 6/2010 | Cho | H01J 11/12 313/110 |
| 2014/0214395 A1 | 7/2014 | Valcore, Jr. et al. | |

* cited by examiner

| ZLoad | Coptimum |
|---|---|
| Zload 1 | Coptimum1 |
| Zload 2 | Coptimum2 |
| ⋮ | ⋮ |
| Zload Q | CoptimumQ |

OR  Coptimum = Function(Re(Zload), IM(Zload))

⋯⋯ Polynomial(1)

FIG. 7C

| ZLoad | Coptimum | RFoptimum |
|---|---|---|
| Zload 1 | Coptimum1 | RFoptimum1 |
| Zload 2 | Coptimum2 | RFoptimum2 |
| ⋮ | ⋮ | ⋮ |
| Zload Q | CoptimumQ | RFoptimumQ |

OR

RFoptimum = Function(Re(Zload), Im(Zload)), Coptimum)

- - - - - Polynomial(2)

SYSTEMS AND METHODS FOR USING COMPUTER-GENERATED MODELS TO REDUCE REFLECTED POWER TOWARDS A HIGH FREQUENCY RF GENERATOR DURING A CYCLE OF OPERATIONS OF A LOW FREQUENCY RF GENERATOR

CLAIM OF PRIORITY

This application is a continuation-in-part of and claims the benefit, under 35 U.S.C. § 120, of and priority to co-pending U.S. patent application Ser. No. 14/245,803, filed on Apr. 4, 2014, and entitled "SEGMENTING A MODEL WITHIN A PLASMA SYSTEM", which is incorporated by reference herein in its entirety.

The U.S. patent application Ser. No. 14/245,803, filed on Apr. 4, 2014, and titled "SEGMENTING A MODEL WITHIN A PLASMA SYSTEM", claims priority, under 35 U.S.C. § 119(e), to U.S. provisional patent application No. 61/821,523, filed on May 9, 2013, and titled "SEGMENTING A MODEL WITHIN A PLASMA SYSTEM".

This application is a continuation-in-part of and claims the benefit, under 35 U.S.C. § 120, of and priority to co-pending U.S. patent application Ser. No. 15/098,566, filed on Apr. 14, 2016, and entitled "SYSTEMS AND METHODS FOR REDUCING REFLECTED POWER DURING STATE TRANSITIONS BY USING RADIO FREQUENCY VALUES", which is a continuation-in-part of and claims the benefit, under 35 U.S.C. § 120, of and priority to co-pending U.S. patent application Ser. No. 15/098,189, filed on Apr. 13, 2016 and entitled "SYSTEMS AND METHODS FOR TUNING AN IMPEDANCE MATCHING NETWORK IN A STEP-WISE FASHION FOR MULTIPLE STATES OF AN RF GENERATOR", both of which are incorporated by reference herein in their entirety.

This application is a continuation-in-part of and claims the benefit, under 35 U.S.C. § 120, of and priority to co-pending U.S. patent application Ser. No. 15/061,705, filed on Mar. 4, 2016, and entitled "SYSTEMS AND METHODS FOR TUNING AN IMPEDANCE MATCHING NETWORK IN A STEP-WISE FASHION", which is incorporated by reference herein in its entirety.

FIELD

The present embodiments relate to systems and methods for reducing reflected power towards a higher frequency radio frequency (RF) generator during a period of a lower frequency RF generator and for using a relationship to reduce reflected power.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner. To process the workpiece in a similar or uniform manner, it is important that the RF sources and the impedance match be tuned.

It is in this context that embodiments described in the present disclosure arise.

SUMMARY

Embodiments of the disclosure provide apparatus, methods and computer programs for reducing reflected towards a higher frequency radio frequency (RF) generator during a period of a lower frequency RF generator and for using a relationship to reduce reflected power. It should be appreciated that the present embodiments can be implemented in numerous ways, e.g., a process, an apparatus, a system, a piece of hardware, or a method on a computer-readable medium. Several embodiments are described below.

In some embodiments, an RF frequency of an RF signal generated by a higher frequency RF generator varies within a period of an RF signal of a lower frequency RF generator. For example, various frequency values of the RF signal generated by the higher frequency RF generator are determined using the model system and applied during a period of the RF signal generated by the lower frequency RF generator.

In several embodiments, a model system is used to tune an impedance matching network in the presence of load impedance variations created by the RF signal generated by the lower frequency RF generator. For example, an optimum combined variable capacitance value is calculated using the model system and applied during the period of the RF signal generated by the lower frequency RF generator.

In various embodiments, the model system is used to calculate tune trajectories, e.g., tune polynomials, tune relationships, etc. Instead of using the model system during processing of a wafer, the impedance matching network is characterized in advance by calculating an optimum combined variable capacitance value on a two-dimensional grid of a real part of load impedance values and an imaginary part of the load impedance values, which span an expected operating space. An optimum RF frequency is then calculated on a three-dimensional grid of the real part of load impedance values, the imaginary part of the load impedance values, and combined variable capacitance values. A first fit to various optimum combined variable capacitance values and a second fit to various optimum RF frequencies results in polynomial functions as solutions. An example of the first fit is that an optimum combined variable capacitance value=Function(Re(Z Load), Im(Z Load)), where Zload is a load impedance value, Re is a real part of the load impedance value, and Im is imaginary part of the load impedance value. An example of the second fit is that an optimum RF frequency at a given optimum combined variable capacitance value=Function (Re(Z Load), Im(Z Load), optimum combined variable capacitance value).

Some advantages of the herein described systems and methods include determining RF values during each RF cycle of the lower frequency RF generator to reduce power reflected towards the higher frequency RF generator. The model system is used to determine the RF values during each RF cycle of the lower frequency RF generator. The RF values are calculated from parameter values calculated at an output of the higher frequency RF generator during an RF cycle of the lower frequency RF generator. The RF values that are determined are applied to the higher frequency RF generator during an RF cycle of the lower frequency RF generator that follows the RF cycle during which the parameter values are calculated. The application of the RF values precisely reduce power reflected towards the higher frequency RF generator during each RF cycle of the lower frequency RF generator.

Other advantages of the herein described systems and methods include not using the model system to determine optimum RF values and/or optimum combined variable capacitance values during processing of a wafer. The optimum RF values and/or optimum combined variable capacitance values are pre-determined before processing of the wafer. During the processing of the wafer, the optimum RF values and/or optimum combined variable capacitance values are accessed by a processor and applied based on load impedance values that are determined using the model system. The pre-calculation of the optimum RF values and/or optimum combined variable capacitance values saves time during the processing of the wafer.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 7C is an embodiment of a table and a polynomial, both of which are generated by a processor by applying the model system before a wafer is processed.

DETAILED DESCRIPTION

The following embodiments describe systems and methods for reducing power reflected towards a higher frequency radio frequency (RF) generator during a period of a lower RF generator and for using a relationship to reduce reflected power. It will be apparent that the present embodiments may be practiced without some or all of these specific details. In other instances, well known process operations have not been described in detail in order not to unnecessarily obscure the present embodiments.

Figure 1:
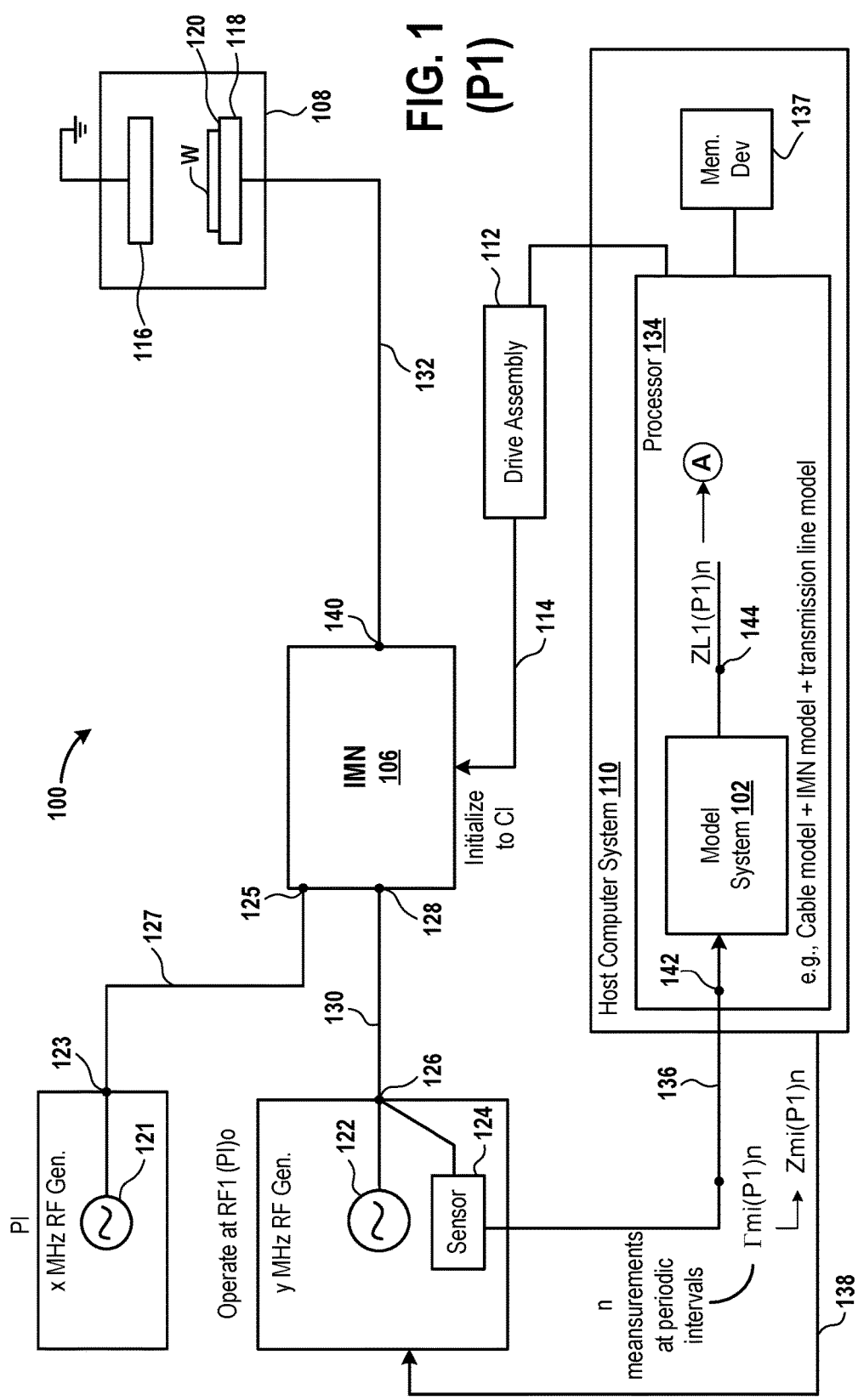
FIG. 1 is a diagram of an embodiment of a plasma system to illustrate generation of a plurality of load impedances ZL(P1)n for a period P1 of a radio frequency (RF) signal generated by an x megahertz (MHz) RF generator.

FIG. 1 is a diagram of an embodiment of a plasma system 100 to illustrate generation of a plurality of load impedances ZL(P1)n using a model system 102 for a period P1 of an RF signal generated by an x megahertz (MHz) RF generator. The plasma system 100 includes the x MHz RF generator, a y MHz RF generator, an impedance matching network 106, and a plasma chamber 108. The plasma system 100 includes a host computer system 110, a drive assembly 112, and one or more connection mechanisms 114.

The plasma chamber 108 includes an upper electrode 116, a chuck 118, and a wafer W. The upper electrode 116 faces the chuck 118 and is grounded, e.g., coupled to a reference voltage, coupled to zero voltage, coupled to a negative voltage, etc. Examples of the chuck 118 include an electrostatic chuck (ESC) and a magnetic chuck. A lower electrode of the chuck 118 is made of a metal, e.g., anodized aluminum, alloy of aluminum, etc. In various embodiments, the lower electrode of the chuck 118 is a thin layer of metal that is covered by a layer of ceramic. Also, the upper electrode 116 is made of a metal, e.g., aluminum, alloy of aluminum, etc. In some embodiments, the upper electrode 116 is made from silicon. The upper electrode 116 is located opposite to and facing the lower electrode of the chuck 118. The wafer W is placed on a top surface 120 of the chuck 118 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

In some embodiments, the plasma chamber 108 is formed using additional parts, e.g., an upper electrode extension that surrounds the upper electrode 116, a lower electrode extension that surrounds the lower electrode of the chuck 118, a dielectric ring between the upper electrode 116 and the upper electrode extension, a dielectric ring between the lower electrode and the lower electrode extension, confinement rings located at edges of the upper electrode 116 and the chuck 118 to surround a region within the plasma chamber 108 in which plasma is formed, etc.

The impedance matching network 106 includes one or more circuit components, e.g., one or more inductors, or one or more capacitors, or one or more resistors, or a combination or two or more thereof, etc., which are coupled with each other. For example, the impedance matching network 106 includes a series circuit that includes an inductor coupled in series with a capacitor. The impedance matching network 106 further includes a shunt circuit connected to the series circuit. The shunt circuit includes a capacitor connected in series with an inductor. The impedance matching network 106 includes one or more capacitors and corresponding capacitances of the one or more capacitors, e.g., all variable capacitors, etc., are variable, e.g., are varied using a drive assembly, etc. The impedance matching network 106 includes one or more capacitors that have fixed capacitances, e.g., which cannot be changed using the drive assembly 112, etc. A combined variable capacitance of the one or more variable capacitors of the impedance matching network 106 is a value C1. For example, corresponding oppositely-located plates of the one or more variable capacitors are adjusted to be at a fixed position to set the variable capacitance C1. To illustrate, the combined capacitance of two or more capacitors that are connected to each other in parallel is a sum of capacitances of the capacitors. As another illustration, the combined capacitance of two or more capacitors that are connected to each other in series is an inverse of a sum of inverses of capacitances of the capacitors. An example of an impedance matching network 106 is provided in the patent application having application Ser. No. 14/245,803.

In some embodiments, the model system 102 includes a computer-generated model of the impedance matching network 106. For example, the model system 102 is generated by a processor 134 of the host computer system 110. The match network model is derived from e.g., represents, etc., a branch of the impedance matching network 106. For example, when the y MHz RF generator is connected to the branch circuit of the impedance matching network 106, the match network model represents, e.g., is a computer-generated model of, etc., the circuit of the branch circuit of the impedance matching network 106. As another example, the match network model does not have the same number of circuit components as that of the impedance matching network 106.

In some embodiments, the match network model has a lower number of circuit elements than a number of circuit components of the impedance matching network 106. To illustrate, the match network model is a simplified form of the branch circuit of the impedance matching network 106. To further illustrate, variable capacitances of multiple variable capacitors of the branch circuit of the impedance matching network 106 are combined into a combined variable capacitance represented by one or more variable capacitive elements of the match network model, fixed capacitances of multiple fixed capacitors of the branch circuit of the impedance matching network 106 are combined into a combined fixed capacitance represented by one or more fixed capacitive elements of the match network model, and/or inductances of multiple fixed inductors of the branch circuit of the impedance matching network 106 are combined into a combined inductance represented by one or more inductive elements of the match network model, and/or resistances of multiple resistors of the branch circuit of the impedance matching network 106 are combined into a fixed resistance represented by one or more of resistive elements of the match network model. To illustrate more, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the branch circuit of the impedance matching network 106 are combined into a combined fixed capacitance of one or more fixed capacitive elements of the match network model. Other examples of the match network model are provided in the patent application having application Ser. No. 14/245,803. Also, a manner of generating a match network model from an impedance matching network is described in the patent application having application Ser. No. 14/245,803.

In some embodiments, the match network model is generated from a schematic for the impedance matching network 106 that has three branches, one each for x MHz, y MHz, and z MHz RF generators. The three branches join each other at an output 140 of the impedance matching network 106. The schematic initially includes a number of inductors and capacitors in various combinations. For one of the three branches considered individually, the match network model represents one of the three branches. Circuit elements are added to the match network model via an input device, examples of which are provided below. Examples of circuit elements added include resistors, not previously included in the schematic, to account for power losses in the branch of the impedance matching network 106, include inductors, not previously included in the schematic, to represent an inductance of various connecting RF straps, and include capacitors, not previously included in the schematic, to represent parasitic capacitances. Moreover, some circuit elements are further added to the schematic via the input device to represent a transmission line nature of the branch of the impedance matching network 106 because of physical dimensions of the impedance matching network 106. For example, an uncoiled length of one or more inductors in the branch of the impedance matching network 106 is not negligible compared to a wavelength of an RF signal passing via the one or more inductors. To account for this effect, an inductor in the schematic is divided into 2 or more inductors. Thereafter, some circuit elements are removed via the input device from the schematic to generate the match network model.

In various embodiments, the match network model has the same topology, e.g., connections between circuit elements, number of circuit elements, etc., as that of the branch circuit of the impedance matching network 106. For example, if the branch circuit of the impedance matching network 106 includes a capacitor coupled in series with an inductor, the match network model includes a capacitor coupled in series with an inductor. In this example, the inductors of the branch circuit of the impedance matching network 106 and of the match network model have the same value and the capacitors of the branch circuit of the impedance matching network 106 and of the match network model have the same value. As another example, if the branch circuit of the impedance matching network 106 includes a capacitor coupled in parallel with an inductor, the match network model includes a capacitor coupled in parallel with an inductor. In this example, the inductors of the branch circuit of the impedance matching network 106 and of the match network model have the same value and the capacitors of the branch circuit of the impedance matching network 106 and of the model system 102 have the same value. As another example, the match network model has the same number and same types of circuit elements as that of circuit components of the impedance matching network 106 and has the same type of connections between the circuit elements as that between the circuit components. Examples of types of circuit elements include resistors, inductors, and capacitors. Examples of type of connections include serial, parallel, etc.

In various embodiments, the model system 102 includes a combination of the match network model and the RF transmission model. An input of the match network model is the input 142. The RF transmission model is connected in series to an output of the match network model and has the output 144. The RF transmission model is derived from the RF transmission line 132 in a similar manner in which the match network model is derived from the impedance matching network 106. For example, the RF transmission model has inductances, capacitances, and/or resistances that are derived from inductances, capacitances, and/or resistances of the RF transmission line 132. As another example, a capacitance of the RF transmission model matches a capacitance of the RF transmission line 132, an inductance of the RF transmission model matches an inductance of the RF transmission line 132, and a resistance of RF transmission model matches a resistance of the RF transmission line 132.

In some embodiments, the model system 102 includes a combination of an RF cable model, the match network model, and an RF transmission model. An input of the RF cable model is the input 142. An output of the RF cable model is connected to an input of the match network model and an output of the match network model is connected to an input of the RF transmission model. The RF transmission model has the output 144. The RF cable model is derived from the RF cable 130 in a similar manner in which the match network model is derived from the impedance matching network 106. For example, the RF cable model has inductances, capacitances, and/or resistances that are derived from inductances, capacitances, and/or resistances of the RF cable 130. As another example, a capacitance of the RF cable model matches a capacitance of the RF cable 130, an inductance of the RF cable model matches an inductance of the RF cable 130, and a resistance of RF cable model matches a resistance of the RF cable 130.

The x MHz RF generator includes an RF power supply 121 for generating the RF signal. The RF power supply 121 has an output 123, which is also an output of the x MHz RF generator. The output 123 is connected to an input 125 of the impedance matching network 106 via an RF cable 127. The x MHz RF generator is connected to an additional branch of the impedance matching network 106 via the input 125 of the additional branch, and the additional branch is different from the branch circuit to which the y MHz RF generator is connected at an input 128 of the branch circuit. For example, the additional branch includes a different combination of one or more resistors, and/or one or more capacitors, and/or one or more inductors than a combination of one or more resistors, and/or one or more capacitors, and/or one or more inductors within the branch circuit that is connected to the input 128. Both the additional branch connected to the input 125 and the branch circuit connected to the input 128 are connected to the output 140.

Moreover, the y MHz RF generator includes an RF power supply 122 for generating the RF signal. The y MHz RF generator includes a sensor 124, e.g., a complex impedance sensor, a complex current and voltage sensor, a complex reflection coefficient sensor, a complex voltage sensor, a complex current sensor, etc., that is connected to an output 126 of the y MHz RF generator. The output 126 is connected to the input 128 of the branch circuit of the impedance matching network 106 via an RF cable 130. The impedance matching network 106 is connected to the plasma chamber 108 via the output 140 and an RF transmission line 132, which includes an RF rod and an RF outer conductor that surrounds the RF rod.

The drive assembly 112 includes a driver, e.g., one or more transistors, etc., and a motor, and the motor is connected via the connection mechanism 114 to a variable capacitor of the impedance matching network 106. Examples of the connection mechanism 114 include one or more rods, or rods that are connected to each other via a gear, etc. The connection mechanism 114 is connected to a variable capacitor of the impedance matching network 106. For example, the connection mechanism 114 is connected to a variable capacitor that is a part of the branch circuit that is connected to the y MHz RF generator via the input 128.

It should be noted that in case the impedance matching network 106 includes more than one variable capacitor in the branch circuit that is connected to the y MHz RF generator, the drive assembly 112 includes separate motors for controlling the more than one variable capacitor, and each of the motors is connected via a corresponding connection mechanism to the corresponding variable capacitor. In this case, the multiple connection mechanisms are referred to as the connection mechanism 114.

In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kHz RF generator, an example of the y MHz RF generator includes a 27 MHz RF generator, and an example of the z MHz RF generator includes a 60 MHz RF generator.

It should be noted that in case three RF generators, e.g., the x, y, and z MHz RF generators, etc., are used in the plasma system 100, the x MHz RF generator is connected to the input 125 of the impedance matching network 106, the y MHz RF generator is connected to the input 128 of the impedance matching network 106, and a third one of the RF generators is connected to a third input of the impedance matching network 106. The output 140 is connected to the input 125 via the additional branch of the impedance matching network 106 and the output 140 is connected to the input 128 via the branch circuit of the impedance matching network 106. The output 140 is connected to the third input via a third circuit branch of the impedance matching network 106.

The host computer system 110 includes the processor 134 and a memory device 137. The memory device 137 stores the model system 102. The model system 102 is accessed from the memory device 137 for execution by the processor 134. Examples of the host computer 110 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. The sensor 124 is connected to the host computer system 110 via a network cable 136. Examples of a network cable, as used herein, is a cable used to transfer data in a serial manner, or in a parallel manner, or using a Universal Serial Bus (USB) protocol, etc.

During the period P1 of the RF signal generated by the x MHz RF generator, the y MHz RF generator, which has the higher frequency than that of the x MHz RF generator, is operated at a plurality of radio frequency values RF1(P1)o, where o is an integer greater than zero. Examples of the radio frequency values RF1(P1)o include RF1(P1)1, RF1(P1)2, RF1(P1)3, etc. For example, the processor 134 provides a recipe that includes the radio frequency values RF1(P1)o and a plurality of power levels for the period P1 to the y MHz RF generator.

In various embodiments, each of the x and y MHz RF generators receive a clock signal from the processor 134 or from a clock source, e.g., an oscillator, etc., within the host computer system 110. During the period P1 of the x MHz RF generator, the y MHz RF generator generates an RF signal that has multiple periods. For example, upon receiving the clock signal, during a clock cycle of the clock signal, the x MHz RF generator generates an RF signal having the period P1, which repeats during the clock cycle. To illustrate, the RF signal that is generated by the x MHz RF generator repeats at the period P1. Moreover, in the example, upon receiving the clock signal, during the clock cycle of the clock signal, the y MHz RF generator generates the RF signal having multiple periods within the period P1. To illustrate, the RF signal generated by the y MHz RF generator repeats oscillations multiple times during the period P1, which is one oscillation of the RF signal generated by the x MHz RF generator.

During the period P1 of the RF signal generated by the x MHz RF generator, the y MHz RF generator receives the recipe via a network cable 138 that is connected to the y MHz RF generator and the host computer system 110, and a digital signal processor (DSP) of the y MHz RF generator provides the recipe to the RF power supply 122. The RF power supply 122 generates the RF signal that has the radio frequency values RF1(P1)o and the power levels prescribed in the recipe.

The impedance matching network 106 is initialized to have the combined variable capacitance C1. For example, the processor 134 sends a signal to the driver of the drive assembly 112 to generate one or more current signals. The one or more current signals are generated by the driver and sent to corresponding one or more stators of corresponding one or more motors of the drive assembly 112. One or more rotors of the drive assembly 112 that are in electrical field contact with the corresponding one or more stators rotate to move the connection mechanism 114 to change the combined variable capacitance of the branch circuit of the impedance matching network 106 to C1. The branch circuit of the impedance matching network 106 having the combined variable capacitance C1 receives the RF signal having the radio frequency values RF1(P1)o from the output 126 via the input 128 and the RF cable 130. Moreover, the additional branch of the impedance matching network 106 receives the RF signal from the output 123 of the x MHz RF generator via the RF cable 127 and the input 125. Upon receiving the RF signals from the x and y MHz RF generators, the impedance matching network 106 matches an impedance of the load connected to the impedance matching network 106 with that of a source connected to the impedance matching network 106 to generate a modified signal, which is an RF signal. Examples of the load include the plasma chamber 108 and the RF transmission line 132. Examples of the source include the RF cable 127, the RF cable 130, the x MHz RF generator, and the y MHz RF generator. The modified signal is provided from the output 140 of the branch circuit of the impedance matching network 106 via the RF transmission line 132 to the chuck 118. When the modified signal is provided to the chuck 118 in conjunction with one or more process gases, e.g., oxygen containing gas, fluorine containing gas, etc., plasma is produced or is maintained in a gap between the chuck 118 and the upper electrode 116.

During a time the RF signal having the radio frequency RF1(P1)o is generated, the impedance matching network 106 has the combined variable capacitance C1, and the x MHz RF generator generates the period P1 of the RF signal, the sensor 124 senses a plurality of voltage reflection coefficients Γmi(P1)n at the output 126 and provides the voltage reflection coefficients Γmi(P1)n via the network cable 136 to the processor 134, where n is an integer greater than zero. For example, during the period P1, the sensor 124 measures the voltage reflection coefficients Γmi(P1)n at pre-determined periodic time intervals, e.g., every 0.3 microseconds, every 0.5 microseconds, every 0.1 microseconds, a constant fraction of a microsecond, every 0. v microseconds, etc., where n is the number of time intervals and is the same as the number of voltage reflection coefficients Γmi(P1)n, and v is a real number greater than 0 and less than 10. To further illustrate, the sensor 124 measures, during the period P1, the voltage reflection coefficient Γmi(P1)1 at 0.3 microseconds from a beginning of the period P1 and measures the voltage reflection coefficient Γmi(P1)2 at 0.6 microseconds from the beginning of the period P1. An example of a voltage reflection coefficient includes a ratio of a voltage reflected towards the y MHz RF generator from the plasma chamber 108 and voltage supplied within the RF signal generated by the y MHz RF generator.

As another example, the period P1 of the 400 kHz RF signal is divided into 8 sub-periods, e.g., ΔT1, ΔT2, ΔT3, ΔT4, ΔT5, ΔT6, ΔT7, ΔT8. Each of these sub-periods is a short time interval equal to P⅛, or about 0. v microseconds, etc. In some embodiments, as the 400 kHz frequency varies between 350 and 450 kHz, duration of each of these sub-periods is made longer or shorter by the processor 134, and a number of the sub-periods is increased or decreased by the processor 134. A start of the period P1 of the 400 kHz RF signal is detected by the processor 134 and the start of the period marks a beginning of the sub-period ΔT1 and each additional ΔT2 through ΔT8 follows the sub-period ΔT1 in a sequence. Eight measurements of the voltage reflection coefficients Γmi(P1)n associated with the 60 MHz RF generator are made, e.g., Γmi(P1)1, Γmi(P1)2, Γmi(P1)3, Γmi(P1)4, Γmi(P1)5, Γmi(P1)6, Γmi(P1)7, Γmi(P1)8. In some embodiments, the eight measurements are made over the period P1. In various embodiments, the eight measurements, Γmi(P1)1, Γmi(P1)2, Γmi(P1)3, Γmi(P1)4, Γmi(P1)5, Γmi(P1)6, Γmi(P1)7, and Γmi(P1)8 are made over multiple periods, e.g., the period P1 and a period P(1+1) and a period P(1+2), etc., of the 400 kHz RF signal. It should be noted that eight measurements is an example, and in some embodiments, any number of measurements of voltage reflection coefficients are made during the period P1 or over the multiple periods.

The processor 134 calculates a plurality of impedances Zmi(P1)n from the voltage reflection coefficients Γmi(P1)n. For example, the processor 134 calculates an impedance Zmi(P1)1 by applying an equation (1), which is Γmi(P1)1=

(Zmi(P1)1−Zo)/(Zmi(P1)1+Zo), and solving for Zmi(P1)1, where Zo is a characteristic impedance of the RF transmission line 132. As another example, the processor 134 calculates an impedance Zmi(P1)2 by applying an equation (2), which is Γmi(P1)2=(Zmi(P1)2−Zo)/(Zmi(P1)2+Zo), and solving for Zmi(P1)2. The impedance Zo is provided to the processor 134 via the input device, e.g., a mouse, a keyboard, a stylus, a keypad, a button, a touch screen, etc., that is connected to the processor 134 via an input/output interface, e.g., a serial interface, a parallel interface, a USB interface, etc. In some embodiments, the sensor 124 measures the impedances Zmi(P1)n and provides the impedances Zmi(P1)n via the network cable 136 to the processor 134.

The impedances Zmi(P1)n are applied by the processor 134 to an input 142 of the model system 102 and are forward propagated via the model system 102 to calculate a plurality of load impedances ZL(P1)n at an output 144 of the model system 102. The model system 102 is initialized by the processor 134 to have the combined variable capacitance C1 and the plurality of radio frequency values RF1(P1)o. For example, the impedance Zmi(P1)1 is forward propagated by the processor 134 via one or more circuit elements of the model system 102 to generate the load impedance ZL(P1)1. To illustrate, the model system 102 is initialized to have the radio frequency RF1(P1)1 and the combined variable capacitance C1. When the model system 102 includes a series combination of a resistive element, an inductive element, a fixed capacitive element, and a variable capacitive element, the processor 134 calculates a directional sum of the impedance Zmi(P1)1 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL(P1)1. As another example, the impedance Zmi(P1)2 is forward propagated by the processor 134 via one or more circuit elements of the model system 102 to generate the load impedance ZL(P1)2. To illustrate, the model system 102 is initialized to have the radio frequency RF1(P1)2 and the combined variable capacitance C1. When the model system 102 includes a series combination of a resistive element, an inductive element, a fixed capacitive element, and a variable capacitive element, the processor 134 calculates a directional sum of the impedance Zmi(P1)2 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL(P1)2.

In various embodiments, instead of measuring a voltage reflection coefficient at the output 126, a voltage reflection coefficient is measured at any point, on the RF cable 130, from and including the output 126 to the input 128. For example, the sensor 124 is connected to the point between RF power supply 122 and the impedance matching network 106 to measure a voltage reflection coefficient.

In some embodiments, each of the measured voltage reflection coefficients Γmi(P1)n is weighted by the processor 134 according to a pre-assigned weight. The weights applied by the processor 134 to the voltage reflection coefficients Γmi(P1)n are received as inputs via the input device by the processor 134 and are determined based on engineering knowledge and/or process conditions, which are described below. Instead of applying the voltage reflection coefficients Γmi(P1)n, weighted voltage reflection coefficients wΓmi(P1)n are applied to the model system 102 to determine the load impedances ZL(P1)n, where each w is the pre-assigned weight.

Figure 2:
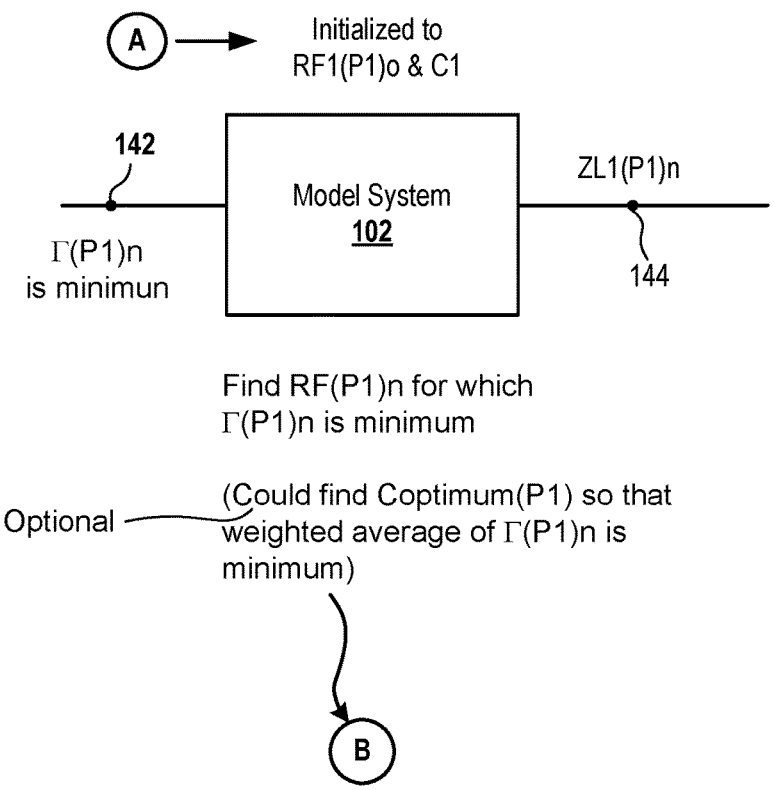
FIG. 2 is a diagram of an embodiment of a model system that is initialized to have multiple radio frequency values RF1(P1)o and a variable capacitance C1 to determine a plurality of radio frequency values RF(P1)n.

FIG. 2 is a diagram of an embodiment of the model system 102 that is initialized to have the radio frequency values RF1(P1)o and the variable capacitance C1 to determine a plurality of radio frequency values RF(P1)n. For each of the radio frequency values RF(P1)n, a voltage reflection coefficient Γ(P1)n for the period P1 at the input 142 is minimum. The processor 134 calculates from the load impedances ZL(P1)n and the model system 102 a plurality of radio frequency values RF(P1)n. For each of the radio frequency values RF(P1)n, the voltage reflection coefficient Γ(P1) is minimum from among multiple values of the voltage reflection coefficient Γ(P1). For example, the processor 134 back propagates the load impedance ZL(P1)1 via the model system 102, which is initialized to have the radio frequency RF1(P1)1 and the variable capacitance C1, to determine the radio frequency value RF(P1)1 that generates at the input 142 an input impedance Z1 for the period P1. The processor 134 calculates a voltage reflection coefficient Γ(P1)1 from the input impedance Z1 in a manner similar to that described above using equation (1). Moreover, the processor 134 back propagates the load impedance ZL(P1)1 via the model system 102, which is initialized to have the radio frequency RF1(P1)1 and the variable capacitance C1, to determine a radio frequency value RF(P1)1_1 that generates at the input 142 an input impedance Z2 for the period P1. The processor 134 calculates a voltage reflection coefficient Γ(P1)2 from the input impedance Z2 in a manner similar to that described above using equation (1). The processor 134 determines that the voltage reflection coefficient Γ(P1)1 is less than the voltage reflection coefficient Γ(P1)2, and determines that the radio frequency value RF1(P1)1 is one for which the voltage reflection coefficient Γ(P1)1 is a minimum.

As another example, the processor 134 back propagates the load impedance ZL(P1)2 via the model system 102, which is initialized to have the radio frequency RF1(P1)2 and the variable capacitance C1, to determine the radio frequency value RF(P1)2 that generates at the input 142 an input impedance Z3 for the period P1. The processor 134 calculates a voltage reflection coefficient Γ(P1)3 from the input impedance Z3 in a manner similar to that described above using equation (2). Moreover, the processor 134 back propagates the load impedance ZL(P1)2 via the model system 102, which is initialized to have the radio frequency RF1(P1)2 and the variable capacitance C1, to determine a radio frequency value RF(P1)2_2 that generates at the input 142 an input impedance Z4 for the period P1. The processor 134 calculates a voltage reflection coefficient Γ(P1)4 from the input impedance Z4 in a manner similar to that described above using equation (2). The processor 134 determines that the voltage reflection coefficient Γ(P1)3 is less than the voltage reflection coefficient Γ(P1)4, and determines that the radio frequency value RF(P1)2 is one for which the voltage reflection coefficient Γ(P1)3 is a minimum.

It should be noted that the value ZL(P1)1 is determined from the value Zmi(P1)1, which is measured at an end of a first time period, e.g., t1, etc., from the beginning of the period P1 and during the period P1. The value ZL(P1)2 is determined from the load value Zmi(P1)2, which is measured at an end of a second time period, e.g., t2, etc., from the first time period and during the period P1. The second time period t2 is consecutive to the first time period t1 and is equal in length to the first time period t1. In various embodiments, the voltage reflection coefficient $\Gamma(P1)1$ is a minimum among all voltage reflection coefficients for the first time period t1 and the voltage reflection coefficient $\Gamma(P1)2$ is a minimum among all voltage reflection coefficients for the second time period t2.

In some embodiments, a non-linear least squares optimization routine is executed by the processor 134 to solve for and calculate from the load impedance $ZL(P1)n$ and the model system 102 the radio frequency values $RF(P1)n$. For each of the radio frequency values $RF(P1)n$, the voltage reflection coefficient $\Gamma(P1)n$ for the period P1 is minimum. In various embodiments, pre-determined equations are applied by the processor 134 to solve for and calculate from the load impedance $ZL(P1)n$ and the model system 102 the radio frequency values $RF(P1)n$.

In various embodiments, a value of a radio frequency of the model system 102 for which a voltage reflection coefficient $\Gamma$ at the input 142 is a minimum is referred to herein as a favorable RF value.

In some embodiments, an RF value is sometimes referred to herein as a "parametric value". Moreover, a capacitance is sometimes referred to herein as a "measurable factor".

In various embodiments, a value of a combined variable capacitance $Coptimum(P1)$ for the period P1 is calculated by the processor 134 in addition to or instead of determining the radio frequency values $RF(P1)n$. For example, the processor 134 calculates the combined variable capacitance $Coptimum(P1)$ for which a weighted average of the voltage reflection coefficients $\Gamma(P1)n$ at the input 142 is minimum. To illustrate, the processor 134 calculates a weighted average of the voltage reflection coefficients $h(P1)n$. The processor 134 back propagates the load impedance $ZL(P1)n$ via the model system 102 to determine the combined variable capacitance $Coptimum(P1)$ for which the weighted average of the voltage reflection coefficients $\Gamma(P1)n$ is minimum. To illustrate, the processor 134 back propagates any of the load impedances $ZL(P1)n$, e.g., $ZL(P1)1$ or $ZL(P1)2$, etc., via the model system 102 to determine a combined variable capacitance $Coptimum(P1)1$ for which the weighted average of the voltage reflection coefficients $\Gamma(P1)n$ has a first value. When any of the load impedances $ZL(P1)n$ are back propagated, the model system 102 is initialized to any of the corresponding radio frequency values $RF1(P1)n$ and the variable capacitance C1. For example, when the load impedance $ZL(P1)1$ is back propagated, the model system 102 is initialized to the corresponding radio frequency value $RF1(P1)1$ and when the load impedance $ZL(P1)2$ is back propagated, the model system 102 is initialized to the corresponding radio frequency value $RF1(P1)2$. Continuing further with the illustration, the processor 134 back propagates any of the load impedances $ZL(P1)n$ via the model system 102 to determine another combined variable capacitance $Coptimum(P1)2$ for which the weighted average of the voltage reflection coefficients $\Gamma(P1)n$ has a second value. The processor 134 determines that the first value is lower than the second value, and determines that the combined variable capacitance $Coptimum(P1)1$ is the optimum combined variable capacitance $Coptimum(P1)$ for which the weighted average of the voltage reflection coefficients $\Gamma(P1)n$ is minimum. It should be noted that a weight of each of the voltage reflection coefficients $\Gamma(P1)n$ to generate the weighted average is received from the input device by the processor 134.

In various embodiments, instead of obtaining the n measurements of the voltage reflection coefficients $\Gamma mi(P1)n$ from the sensor 124 (FIG. 1), q measurements of voltage reflection coefficients $\Gamma mi(P1)q$ are generated by the sensor 124, where q is greater than n and is an integer greater than zero. The processor 134 forward propagates the voltage reflection coefficients $\Gamma mi(P1)q$ via the model system 102 to generate q values of load impedances $ZL(P1)q$ at the output 144 of the model system 102. The model system 102 is initialized to have the variable capacitance C1 and the values $RF1(P1)o$. The processor 134 divides the load impedances $ZL(P1)q$ into n equal segments and calculates an average of load impedances within each of the n segments. For example, the processor 134 calculates a first average of 10 measurements $ZL(P1)1$ to $ZL(P1)10$ and calculates a second average of 10 measurements $ZL(P1)11$ to $ZL(P1)20$, where 1, 10, 11, and 20 are examples of q. The first average is an example of one of the load impedances $ZL(P1)n$ and the second average is an example of another one of the load impedances $ZL(P1)n$.

In some embodiments, instead of minimizing the voltage reflection coefficient $\Gamma(P1)n$, another parameter, e.g., a power reflection coefficient, etc., is minimized at the input 142.

Figure 3:
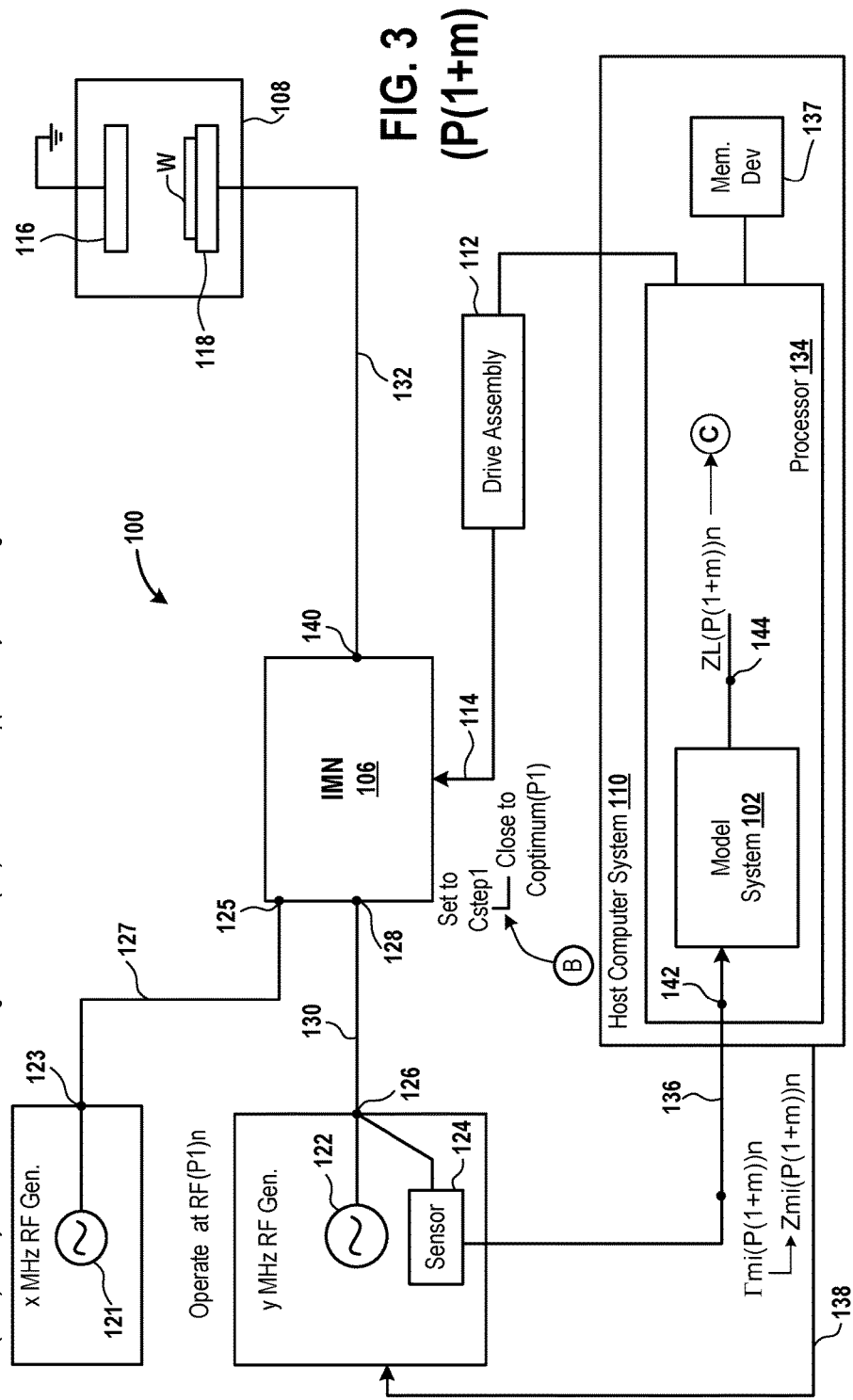
FIG. 3 is a diagram of an embodiment of the plasma system to illustrate generation of a plurality of load impedances ZL(P(1+m))n using the model system for a period P(1+m) of the RF signal generated by the x MHz RF generator.

FIG. 3 is a diagram of an embodiment of the plasma system 100 to illustrate generation of a plurality of load impedances $ZL(P(1+m))n$ using the model system 102 for a period $P(1+m)$ of the RF signal generated by the x MHz RF generator, where m is an integer greater than zero. The period $P(1+m)$ follows the period P1. For example, a first oscillation of the RF signal generated by the x MHz RF generator is immediately followed by a second oscillation of the RF signal. The second oscillation is consecutive to the first oscillation and there is no other oscillation between the first and second oscillations. The second oscillation has the period P2 of time and the first oscillation has the period P1 of time. In some embodiments, a length of time of the period P2 is the same as a length of time of the period P1. As another example, the first oscillation of the RF signal generated by the x MHz RF generator is not immediately followed by the second oscillation of the RF signal but is immediately followed by one or more oscillations, which is further immediately followed by the (1+m)th oscillation of the period $P(1+m)$. The (1+m)th oscillation is not consecutive to the first oscillation and there are one or more intermediate oscillations between the first and (1+m)th oscillations. In some embodiments, an amount of time of the clock cycle covered by the period $P(1+m)$ is the same as an amount of time of the clock cycle covered by the period P1.

During the period $P(1+m)$ of the RF signal generated by the x MHz RF generator, the processor 134 modifies the recipe to include the radio frequency values $RF(P1)n$ and provides the radio frequency values $RF(P1)n$ to the y MHz RF generator. Moreover, the processor 134 determines a step variable capacitance value $Cstep1$ for the period $P(1+m)$. To illustrate, a start of the cycle $P(1+m)$ of the 400 kHz RF generator is detected by the processor 134 and the radio frequency value $RF(P(1)1$ is applied for a first portion, e.g., during a first $\frac{1}{8}^{th}$ portion of the cycle $P(1+m)$, etc., of the period $P(1+m)$ of the RF signal. Consecutively, the radio frequency value $RF(P(1)2$ is applied for a second portion, e.g., during a second $\frac{1}{8}^{th}$ portion of the cycle $P(1+m)$, etc., of the period $P(1+m)$ of the RF signal, and so on. The second portion of the period $P(1+m)$ is consecutive to the first portion of the $P(1+m)$. The step variable capacitance value $Cstep1$ is a step in a direction of the value $Coptimum(P1)$ from the value C1.

It should be noted that when one or more capacitances of corresponding one or more variable capacitors of the impedance matching network 106 are modified to change from C1 towards Coptimum(P1), the one or more variable capacitors move slow enough relative to changes in an RF frequency of the RF signal generated by the y MHz RF generator. Instead of setting the combined variable capacitance of the impedance matching network 102 at the value Coptimum(P1), the processor 134 controls the drive assembly 112 so that the combined variable capacitance of the impedance matching network 106 is set at the value Cstep1. It takes a longer time, e.g., in an order of seconds, etc., for the impedance matching network 106 to achieve the variable capacitance Coptimum (P1) than that taken by the y MHz RF generator to generate an RF signal having the radio frequency values RF(P1)n. For example, it takes in an order of microseconds for the y MHz RF generator to achieve the radio frequency values RF(P1)n from the radio frequencies RF1(P1)o. As a result, it is difficult to directly achieve the variable capacitance Coptimum(P1) from the value C1 simultaneous with achieving the radio frequency values RF(P1)n from the values RF1(P1)o so that the voltage reflection coefficient Γ(P1)n at the output 126 of the y MHz RF generator is minimum. Therefore, the variable capacitance of the impedance matching network 106 is adjusted in steps, e.g., Cstep1 etc., in a direction towards the variable capacitance Coptimum(P1) during the period P(1+m).

The processor 134 further controls the y MHz RF generator to operate at the radio frequency values RF(P1)n during the period P(1+m). For the radio frequencies RF(P1)n and the variable capacitance Cstep1, the y MHz RF generator generates the RF signal having the radio frequency values RF(P1)n, which passes to the branch circuit of impedance matching network 106. Moreover, the additional branch of the impedance matching network 106 receives the RF signal from the output 123 of the x MHz RF generator via the RF cable 127 and the input 125. Upon receiving the RF signals from the x and y MHz RF generators, the impedance matching network 106 generates the modified signal, which is provided to the lower electrode 118. When the values RF(P1)n are used instead of the values RF(P1)o, a lesser amount of power is reflected towards the y MHz RF generator during the period P(1+m) compared to the period P1.

During the period P(1+m), when the y MHz RF generator generates the RF signal having the radio frequency values RF(P1)n and the combined variable capacitance is Cstep1, the sensor 124 measures a plurality of voltage reflection coefficients Γmi(P(1+m)n at the output 126. As an example, the period P(1+m) of the 400 kHz RF signal is divided into 8 sub-periods, e.g., ΔT1, ΔT2, ΔT3, ΔT4, ΔT5, ΔT6, ΔT7, ΔT8. Each of these sub-periods is a short time interval equal to P(1+m)/8, or about 0. v microseconds, etc. In some embodiments, as the 400 kHz frequency varies between 350 and 450 kHz, duration of each of these sub-periods is made longer or shorter by the processor 134, and a number of the sub-periods is increased or decreased by the processor 134. A start of the period P(1+m) of the 400 kHz RF signal is detected by the processor 134 and the start of the period marks a beginning of the sub-period ΔT1 and each additional ΔT2 through ΔT8 follows the sub-period ΔT1 in a sequence. Eight measurements of the voltage reflection coefficients Γmi(P(1+m)n associated with the 60 MHz RF generator are made, e.g., ΓmnP(1+m))1, ΓmnP(1+m))2, ΓmnP(1+m))3, ΓmnP(1+m))4, ΓmnP(1+m))5, Γmi(P(1+m))6, Γmi(P(1+m))7, Γmi(P(1+m))8. In some embodiments, the eight measurements are made over the period P(1+m). In various embodiments, the eight measurements Γmi(P(1+m))1, Γmi(P(1+m))2, Γmi(P(1+m))3, Γmi(P(1+m))4, Γmi(P(1+m))5, Γmi(P(1+m))6, Γmi(P(1+m))7, and Γmi(P(1+m))8 are made over multiple periods, e.g., the period P(1+m) and a period P(1+m+1) and a period P(1+m+2), etc., of the 400 kHz RF signal. It should be noted that eight measurements is an example, and in some embodiments, any number of measurements of voltage reflection coefficients are made during the period P(1+m) or over the multiple periods.

During the period P(1+m), the sensor 124 provides the voltage reflection coefficients Γmi(P(1+m))n to the processor 134 via the network cable 136. The processor 134 generates a plurality of impedances Zmi(P(1+m))n from the voltage reflection coefficients Γmi(P(1+m))n in the same manner, described above, in which the impedances Zmi(P1)n are generated from the voltage reflection coefficients Γmi(P1)n. For example, the processor 134 generates the impedance value Zmi(P(1+m))1 from the voltage reflection coefficient Γmi(P(1+m))1, which is measured during the first time period t1 of the period P(1+m) from a beginning of the period P(1+m). Moreover, the processor 134 generates the impedance value Zmi(P(1+m))2 from the voltage reflection coefficient Γmi(P(1+m))2, which is measured at an end of the second time period t2 of the period P(1+m) from the end of the time period t1, which is from the beginning of the period P(1+m).

Moreover, when the model system 102 is set to have the radio frequency values RF(P1)n for the period P(1+m) and the combined variable capacitance Cstep1 for the period P(1+m), the impedances Zmi(P(1+m))n are forward propagated via the model system 102 to generate the load impedances ZL(P(1+m))n at the output 144 of the model system 102 in the same manner in which the load impedances ZL(P1)n are generated at the output 144 from the impedances Zmi(P1)n at the input 142 of the model system 102.

In various embodiments, the combined variable capacitance Cstep1 is closer to the combined variable capacitance Coptimum(P1) compared to the combined variable capacitance C1. For example, the combined variable capacitance Cstep1 is greater than the combined variable capacitance C1, and the combined variable capacitance Coptimum(P1) is greater than the combined variable capacitance Cstep1. As another example, the combined variable capacitance Cstep1 is less than the combined variable capacitance C1, and the combined variable capacitance Coptimum(P1) is less than the combined variable capacitance Cstep1.

In some embodiments, instead of generating an impedance, e.g., the impedances Zmi(P1)n, Zmi(P(1+m))n, etc., from a voltage reflection coefficient, e.g., Γmi(P1)n, Γmi(P(1+m))n, etc., received from the sensor 124, the processor 134 receives the voltage reflection coefficient to generate a plurality of corresponding load voltage reflection coefficients, e.g., ΓL(P1)n, ΓL(P(1+m))n, etc., at the output 144 of the model system 102. The plurality of corresponding load voltage reflection coefficients are applied at the output 144 of the model system 102 in the same manner in which the load impedances, e.g., ZL(P1)n, ZL(P(1+m))n, etc., are applied at the output of the model system 102. There is no need to convert from a voltage reflection coefficient to impedance and vice versa.

In some embodiments, each of the measured voltage reflection coefficients Γmi(P(1+m))n is weighted by the processor 134 according to a pre-assigned weight. The weights applied by the processor 134 to the voltage reflection coefficients Γmi(P(1+m))n are received as inputs via the input device by the processor 134 and are determined based on the engineering knowledge and/or the process conditions. Instead of applying the voltage reflection coefficients Γmi(P(1+m))n, weighted voltage reflection coefficients wΓmi(P (1+m))n are applied to the model system 102 to determine the load impedances ZL(P(1+m))n, where each w is the pre-assigned weight.

In various embodiments, the value Coptimum(P1) and the value Cstep1 are applied to the plasma system 100 without determining and applying the radio frequency values RF(P1)n to the plasma system 100.

Figure 4:
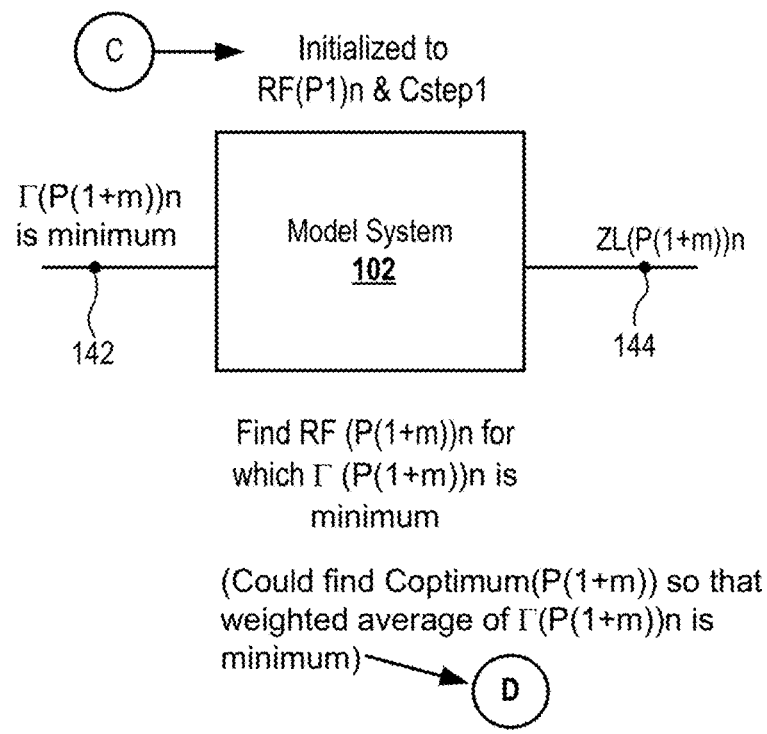
FIG. 4 is a diagram of an embodiment of the model system that is initialized to have the radio frequency values RF(P1)n and a variable capacitance Cstep1 to determine a plurality of radio frequency values RF(P(1+m))n.

FIG. 4 is a diagram of an embodiment of the model system 102 that is initialized to have the radio frequency values RF(P1)n and the variable capacitance Cstep1 to determine a plurality of radio frequency values RF(P(1+m))n. For each of the radio frequency values RF(P(1+m))n, the voltage reflection coefficient Γ(P(1+m))n for the period P(1+m) at the input 142 is minimum. The processor 134 calculates from the load impedances ZL(P(1+m))n and the model system 102 the plurality of radio frequency values RF(P(1+m))n. For each of the radio frequency values RF(P(1+m))n, a voltage reflection coefficient Γ(P(1+m))n at the input 142 is minimum from among multiple values of the voltage reflection coefficient Γ(P(1+m))n. For example, the processor 134 back propagates the load impedance ZL((P(1+m))1 via the model system 102, which is set to have the radio frequency value RF(P1)1 and the variable capacitance Cstep1, to determine a radio frequency value RF(P(1+m))1 that generates at the input 142 an input impedance Z5 for the period P(1+m). The processor 134 calculates a voltage reflection coefficient Γ(P(1+m))5 from the input impedance Z5 in a manner similar to that described above using equation (1). Moreover, the processor 134 back propagates the load impedance ZL((P(1+m))1 via the model system 102, which is set to have the radio frequency value RF(P1)1 and the variable capacitance Cstep1, to determine another radio frequency value RF(P(1+m))1_1 that generates at the input 142 an input impedance Z6 for the period P(1+m). The processor 134 calculates a voltage reflection coefficient Γ(P(1+m))6 from the input impedance Z6 in a manner similar to that described above using equation (1). The processor 134 determines that the voltage reflection coefficient Γ(P(1+m))5 is less than the voltage reflection coefficient Γ(P(1+m))6, and determines that the radio frequency value RF(P(1+m))1 is one for which the voltage reflection coefficient Γ(P(1+m))5 is a minimum.

As another example, the processor 134 back propagates the load impedance ZL((P(1+m))2 via the model system 102, which is set to have the radio frequency value RF(P1)2 and the variable capacitance Cstep1, to determine a radio frequency value RF(P(1+m))2 that generates at the input 142 an input impedance Z7 for the period P(1+m). The processor 134 calculates a voltage reflection coefficient Γ(P(1+m))7 from the input impedance Z7 in a manner similar to that described above using equation (1). Moreover, the processor 134 back propagates the load impedance ZL((P(1+m))2 via the model system 102, which is set to have the radio frequency value RF(P1)2 and the variable capacitance Cstep1, to determine a radio frequency value RF(P(1+m)2_1) that generates at the input 142 an input impedance Z8 for the period P(1+m). The processor 134 calculates a voltage reflection coefficient Γ(P(1+m))8 from the input impedance Z8 in a manner similar to that described above using equation (1). The processor 134 determines that the voltage reflection coefficient Γ(P(1+m))7 is less than the voltage reflection coefficient Γ(P(1+m))8, and determines that the radio frequency value RF(P(1+m))2 is one for which the voltage reflection coefficient Γ(P(1+m))7 is a minimum.

It should be noted that the value ZL(P(1+m)1) is determined from the load value Zmi(P(1+m))1, which is measured at an end of the first time period, e.g., t1, etc., from the beginning of the period P(1+m). The value ZL(P(1+m)2) is determined from the load value Zmi(P(1+m))2, which is measured at an end of the second time period, e.g., t2, etc., from the end of the time period t1, which is from the beginning of the period P(1+m). The second time period for the period P(1+m) is consecutive to the first time period for the period P(1+m). The voltage reflection coefficient Γ(P(1+m))5 is a minimum among all voltage reflection coefficients for the first time period of the period P(1+m) and the voltage reflection coefficient Γ(P(1+m))7 is a minimum among all voltage reflection coefficients for the second time period of the period P(1+m).

In some embodiments, a non-linear least squares optimization routine is executed by the processor 134 to solve for and calculate from the load impedances ZL(P(1+m))n and the model system 102 the radio frequency values RF(P(1+m))n. For each of the radio frequency values RF(P(1+m))n, the voltage reflection coefficient Γ(P(1+m))n for the period P(1+m) is minimum. In various embodiments, pre-determined equations are applied by the processor 134 to solve for and calculate from the load impedances ZL(P(1+m))n and the model system 102 the radio frequency values RF(P(1+m))n.

In some embodiments, a value of a combined variable capacitance Coptimum(P(1+m)) is found for the period P(1+m) in addition to or instead of finding the radio frequency values RF(P(1+m))n. For example, the processor 134 calculates the combined variable capacitance Coptimum (P(1+m)) for which a weighted average of the voltage reflection coefficients Γ(P(1+m))n at the input 142 is minimum. To illustrate, the processor 134 calculates a weighted average of the voltage reflection coefficients Γ(P(1+m))n. The processor 134 back propagates the load impedance ZL(P(1+m))n via the model system 102 to determine the combined variable capacitance Coptimum(P(1+m)) for which the weighted average of the voltage reflection coefficients Γ(P(1+m))n is minimum. To illustrate, the processor 134 back propagates any of the load impedances ZL(P(1+m))n, e.g., ZL(P(1+m))1 or ZL(P(1+m))2, etc., via the model system 102 to determine a combined variable capacitance Coptimum(P(1+m))1 for which the weighted average of the voltage reflection coefficients Γ(P(1+m))n has a first value. When any of the load impedances ZL(P(1+m))n are back propagated, the model system 102 is initialized to any of the corresponding radio frequency values RF(P(1)n and the capacitance Cstep1. For example, when the load impedance ZL(P(1+m))1 is back propagated, the model system 102 is initialized to the corresponding radio frequency value RF(P1)1 and when the load impedance ZL(P(1+m))2 is back propagated, the model system 102 is initialized to the corresponding radio frequency value RF(P1)2. Continuing further with the illustration, the processor 134 back propagates any of the load impedances ZL(P(1+m))n via the model system 102 to determine another combined variable capacitance Coptimum(P(1+m))2 for which the weighted average of the voltage reflection coefficients Γ(P(1+m))n has a second value. The processor 134 determines that the first value is lower than the second value, and determines that the combined variable capacitance Coptimum(P(1+m))1 is the optimum combined variable capacitance Coptimum(P(1+m)) for which the weighted average of the voltage reflection coefficients Γ(P(1+m))n is minimum. It should be noted that a weight of each of the voltage reflection coefficients Γ(P(1+m))n to generate the weighted average is received from the input device by the processor 134.

In various embodiments, instead of obtaining the n measurements of the voltage reflection coefficients Γmi(P(1+ m))n from the sensor 124 (FIG. 3), q measurements of voltage reflection coefficients Γmi(P(1+m))q are generated by the sensor 124. The processor 134 forward propagates the voltage reflection coefficients Γmi(P(1+m))q via the model system 102 to generate q values of load impedances ZL(P (1+m))q at the output 144 of the model system 102. The model system 102 is initialized to have the variable capacitance Coptimum(P1) and the values RF1(P1)n. The processor 134 divides the load impedances ZL(P(1+m))q into n equal segments and calculates an average of load impedances within each of the n segments. For example, the processor 134 calculates a first average of 10 measurements ZL(P(1+m))1 to ZL(P(1+m))10 and calculates a second average of 10 measurements ZL(P(1+m))11 to ZL(P(1+m)) 20, where 1, 10, 11, and 20 are examples of q. The first average is an example of one of the load impedances ZL(P(1+m))n and the second average is an example of another one of the load impedances ZL(P(1+m))n.

In some embodiments, instead of minimizing the voltage reflection coefficient Γ(P(1+m))n, another parameter, e.g., power reflection coefficient, etc., is minimized at the input 142.

Figure 5:
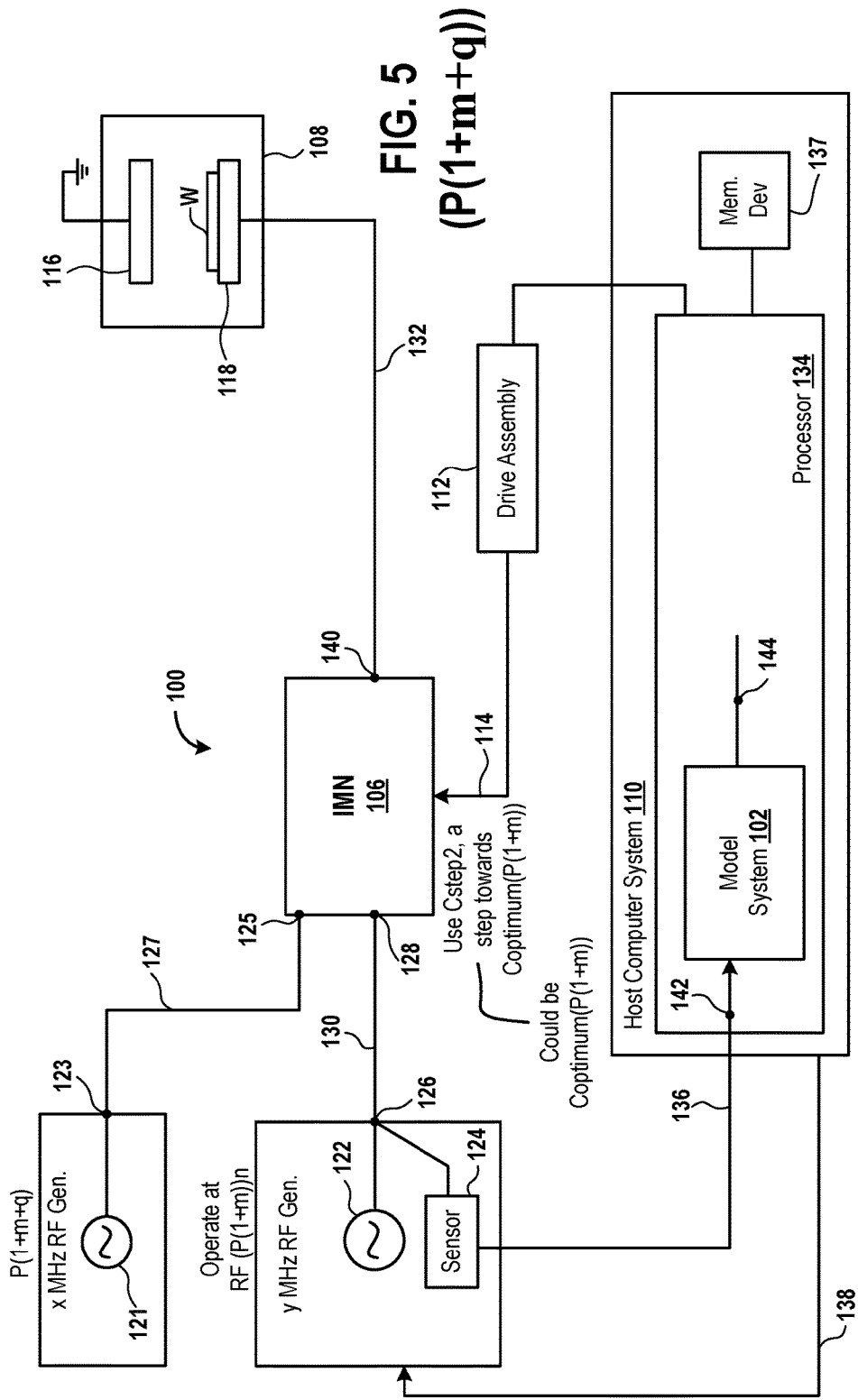
FIG. 5 is a diagram of an embodiment of the plasma system to illustrate use of a capacitance value Coptimum(P(1+m)), and use of the radio frequency values RF(P(1+m))n to process a wafer during a period P(1+m+q) of the RF signal generated by the x MHz RF generator.

FIG. 5 is a diagram of an embodiment of the plasma system 100 to illustrate use of the capacitance value Coptimum(P(1+m)), and use of the radio frequency values RF(P(1+m))n to process the wafer W during a period P(1+m+q) of the RF signal generated by the x MHz RF generator, where q is an integer greater than zero. The period P(1+m+q) follows the period P(1+m) of the RF signal generated by the x MHz RF generator. For example, the second oscillation of the RF signal generated by the x MHz RF generator is immediately followed by a third oscillation of the RF signal. The third oscillation is consecutive to the second oscillation and there is no other oscillation between the second and third oscillations. The third oscillation has the period P3 and the second oscillation has the period P2. In some embodiments, a length of time of the period P3 is the same as a length of time of the period P2. As another example, the second oscillation of the RF signal generated by the x MHz RF generator is not immediately followed by the third oscillation of the RF signal but is immediately followed by one or more oscillations, which is further immediately followed by the (1+m+q)th oscillation of the period P(1+m+q). The (1+m+q)th oscillation is not consecutive to the second oscillation and there are one or more intermediate oscillations between the second and (1+m+q)th oscillations. In some embodiments, an amount of time of the clock cycle covered by the period P(1+m+q) is the same as an amount of time of the clock cycle covered by the period P(1+m).

During the period P(1+m+q) of the RF signal generated by the x MHz RF generator, the processor 134 modifies the recipe during the period P(1+m+q) to include the radio frequency values RF(P(1+m))n and provides the radio frequency values RF(P(1+m))n to the y MHz RF generator. To illustrate, a start of the cycle P(1+m+q) of the 400 kHz RF generator is detected by the processor 134 and the radio frequency value RF(P(1+m))1 is applied for a first portion, e.g., during a first $\frac{1}{8}^{th}$ portion of the cycle P(1+m+q), etc., of the period P(1+m+q) of the RF signal. Consecutively, the radio frequency value RF(P(1+m))2 is applied for a second portion, e.g., during a second $\frac{1}{8}^{th}$ portion of the cycle P(1+m+q), etc., of the period P(1+m+q) of the RF signal, and so on. The second portion of the period P(1+m+q) is consecutive to the first portion of the P(1+m+q). When the values RF(P(1+m))n are used instead of the values RF(P1)n, a lesser amount of power is reflected towards the y MHz RF generator during the period P(1+m+q) compared to the period P(1+m).

Moreover, the processor 134 controls the drive assembly 112 so that the combined variable capacitance of the branch circuit of the impedance matching network 102 is set at a value Cstep2, which is a step towards the optimum combined variable capacitance Coptimum(P(1+m)). It should be noted that in some embodiments, the combined variable capacitance Cstep2 is the same as the combined variable capacitance Coptimum(P(1+m)).

During the period P(1+m+q) of the RF signal generated by the x MHz RF generator, when the combined variable capacitance of the impedance matching network 106 is Cstep2, the y MHz RF generator generates the RF signal having the radio frequency values RF(P(1+m))n. The RF signal having the radio frequency values RF(P(1+m))n passes to the branch circuit of the impedance matching network 106. Moreover, the additional branch of the impedance matching network 106 receives the RF signal from the output 123 of the x MHz RF generator via the RF cable 127 and the input 125. Upon receiving the RF signals from the x and y MHz RF generators, the impedance matching network 106 generates the modified signal, which is provided to the lower electrode 118 for processing the wafer W during the period P(1+m+q).

In various embodiments, the combined variable capacitance Cstep2 is closer to the combined variable capacitance Coptimum(P(1+m)) compared to the combined variable capacitance Cstep1. For example, the combined variable capacitance Cstep2 is greater than the combined variable capacitance Cstep1, and the combined variable capacitance Coptimum(P(1+m)) is greater than the combined variable capacitance Cstep2. As another example, the combined variable capacitance Cstep2 is less than the combined variable capacitance Cstep1, and the combined variable capacitance Coptimum(P(1+m)) is less than the combined variable capacitance Cstep2.

In various embodiments, the value Coptimum(P(1+m)) and the value Cstep2 are applied to the plasma system 100 without determining and applying the radio frequency values RF(P(1+m))n to the plasma system 100.

Figure 6:
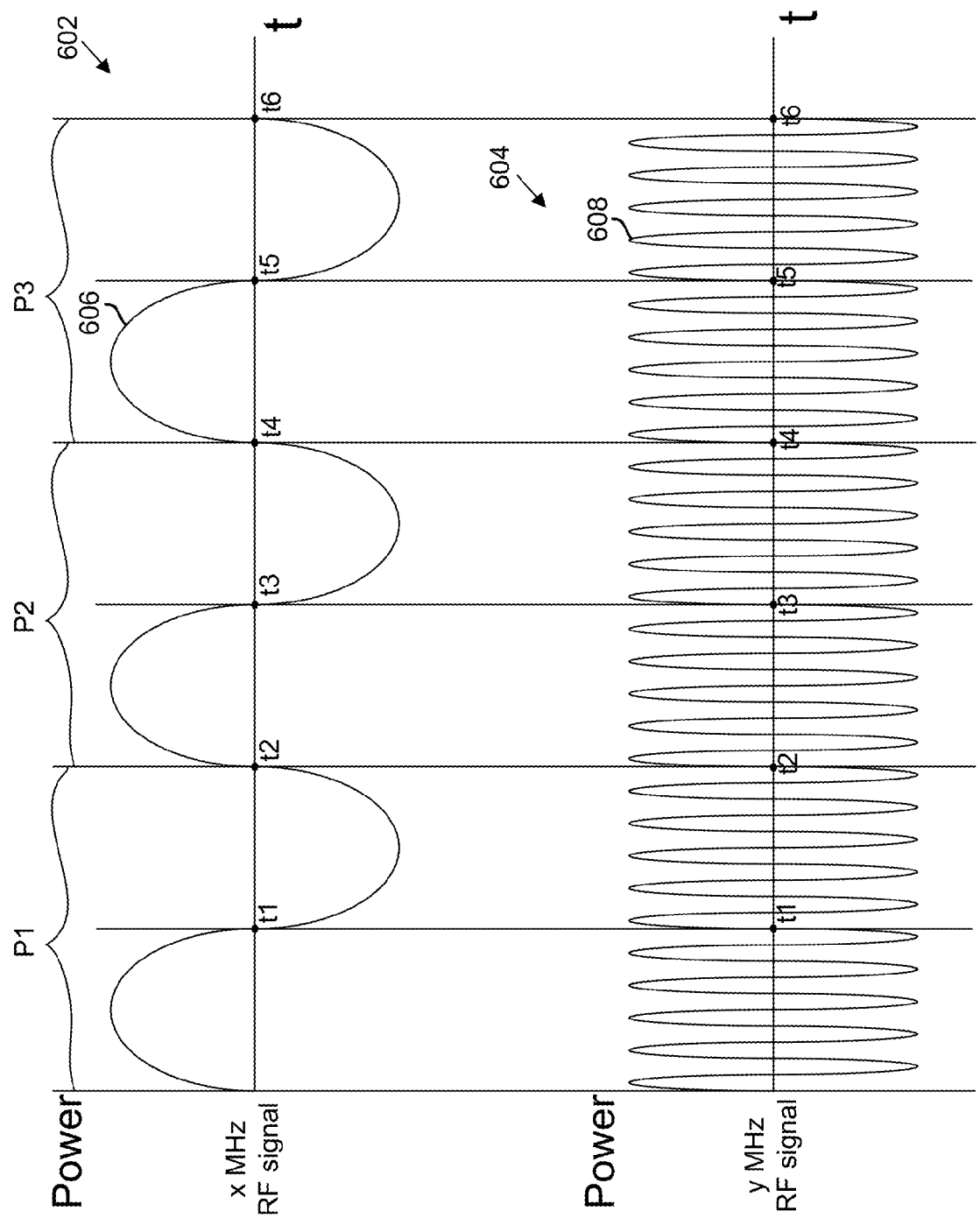
FIG. 6 shows embodiments of graphs to illustrate multiple periods of an RF signal generated by a y MHz RF generator and the multiple periods occur within a period of the RF signal generated by the x MHz RF generator.

FIG. 6 shows embodiments of graphs 602 and 604 to illustrate multiple periods of an RF signal 606 generated by the y MHz RF generator and the multiple periods occur within a period of an RF signal 608 generated by the x MHz RF generator. The graph 602 plots power values of the RF signal 606 on the y-axis versus time t on the x-axis. The graph 604 plots power values of the RF signal 608 on the y-axis versus the time t on the x-axis. The time axis t for both the RF signals 606 and 608 is the same. For example, within a time segment t2, 10 periods of the RF signal 608 occur and the period P1 of the RF signal 606 occurs. Moreover, within a time segment between times t2 and t4, 10 periods of the RF signal 608 occur and the period P2 of the RF signal 606 occurs. Also, within a time segment between times t4 and t6, ten periods of the RF signal 608 occur and the period P3 of the RF signal 606 occurs. Each period of an RF signal generated by an RF generator is sometimes referred to herein as an RF cycle. During each period of the RF signal 606, ten periods of the RF signal 608 occur. Moreover, the period P1 is immediately followed by the period P2 of the RF signal 606. The period P2 is immediately followed by the period P3 of the RF signal 606.

In some embodiments, during one period of the RF signal 606, more than one period, e.g., 100 periods, 200 periods, any period between 100 and 200 periods, etc., of the RF signal 608 occur. Such a ratio between the periods of the RF signal 608 and the RF signal 606 is a ratio of frequencies of the RF signals 608 and 606.

The period P2 is consecutive to the period P1 and the period P3 is consecutive to the period P2. Moreover, the period P3 is not consecutive to the period P1. There is an oscillation of the period P2 between the periods P1 and P3.

Figure 7A:
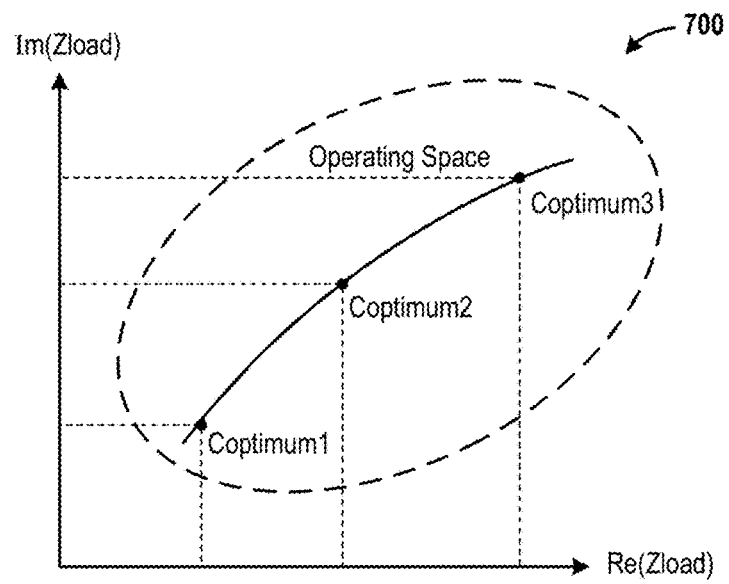
FIG. 7A is an embodiment of a graph to illustrate generation of optimum combined variable capacitance values Coptimum from values of load impedance Zload for various process conditions of a plasma chamber.

FIG. 7A is an embodiment of a graph 700 to illustrate generation of optimum combined variable capacitance values Coptimum, e.g., Coptimum1, Coptimum2, Coptimum3, etc., from values of load impedance Zload for various process conditions of the plasma chamber 108. The graph 700 plots an imaginary part, e.g., reactance, etc., of the load impedance Zload as Im(Zload) on a y-axis and a real part, e.g., resistance, etc., of the load impedance Zload as Re(Zload). Examples of the process conditions include various frequency values of operation of the x MHz RF generator, or various frequency values of operation of the y MHz RF generator, or the gap between the upper electrode 116 and the chuck 118, or temperature within the plasma chamber 108, or pressure within the plasma chamber 108, or power values of the RF signal that is generated by the x MHz RF generator, or power values of the RF signal that is generated by the y MHz RF generator, chemistries of gases within the plasma chamber 108, or a combination of two or more thereof. To illustrate, a process condition 1 includes a frequency value frq1 of the RF signal that is generated by the x MHz RF generator, a power value pwr1 of the RF signal that is generated by the x MHz RF generator, a frequency value frq1 of the RF signal that is generated by the y MHz RF generator, a power value pwr2 of the RF signal is generated by the y MHz RF generator, a temperature tmp1 within the plasma chamber 108, a pressure pr1 within the plasma chamber 108, the gap of gp1 millimeters (mm), and a chemistry of two process gases. A process condition 2 includes a frequency value frq2 of the RF signal that is generated by the x MHz RF generator, a power value pwr2 of the RF signal that is generated by the x MHz RF generator, a frequency value frq3 of the RF signal that is generated by the y MHz RF generator, a power value pwr3 of the RF signal is generated by the y MHz RF generator, the temperature tmp1 within the plasma chamber 108, the pressure pr1 within the plasma chamber 108, the gap of gp1 mm, and the chemistry of two process gases. The value Zload1 corresponds to the process condition 1 and the value Zload2 corresponds to the process condition 2. Similarly, a value ZloadQ corresponds to a process condition Q, where Q is an integer greater than zero. For example, ZloadQ is an impedance measured between the output 140 of the impedance matching network 106 and the chuck 118 when the plasma chamber 108 is operated based on process condition Q. In various embodiments, the plasma chamber 108 is operated using a limited number of process conditions Q, and is not operated outside the limited number.

Figure 7B:
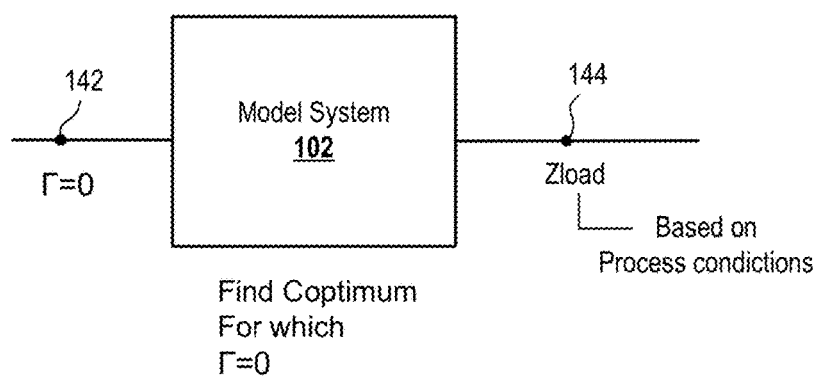
FIG. 7B is a diagram of an embodiment of the model system to illustrate generation of the of optimum combined variable capacitance values Coptimum for which a voltage reflection coefficient Γ at an input of the model system is zero.

FIG. 7B is a diagram of an embodiment of the model system 102 to illustrate generation of the optimum values Coptimum for which a voltage reflection coefficient Γ at the input 142 of the model system 102 is zero. The processor 134 back propagates various values of Zload from the output 144 of the model system 102 via the model system 102 to determine the optimum values Coptimum for which the voltage reflection coefficient Γ at the input 142 is zero. The values of Zload are provided as inputs via the input device or are pre-programmed to be generated by the processor 134, and are restricted based on the process conditions. For example, Zload, which is measured at a point between the output 140 of the impedance matching network 106 and the chuck 118, is Zload1 when a process condition 1 is present within the plasma chamber 108. As another example, Zload, which is measured at the point between the output 140 of the impedance matching network 106 and the chuck 118, is Zload2 when a process condition 2 is present within the plasma chamber 108. In this example, the values of Zload are limited to be Zload1 and Zload2 when the process conditions are limited to be process conditions 1 and 2. The plasma chamber 108 is not operated by using process conditions other than the process conditions. In some embodiments, the plasma chamber 108 cannot be operated by using process conditions other than the process conditions For each value of Zload, a value of the optimum combined variable capacitance Coptimum is determined by the processor 134 via the model system 102. For example for the value Zload1, the capacitance value Coptimum1 is determined for which the voltage reflection coefficient Γ at the input 142 of the model system 102 is zero. Moreover, for the value Zload2, the capacitance value Coptimum2 is determined for which the voltage reflection coefficient Γ at the input 142 of the model system 102 is zero.

In some embodiments, instead of achieving a zero value of the voltage reflection coefficient F, a zero value of another parameter, e.g., power reflection coefficient, etc., is achieved at the input 142.

FIG. 7C is an embodiment of a table 720 and a polynomial (1), both of which are generated by the processor 134. The table 720 includes a correspondence between load impedance values Zload and optimum combined variable capacitance values Coptimum. For example, the processor 134 by applying the model system 102, as explained above with reference to FIG. 7B, determines that for a value ZloadQ, a capacitance value CoptimumQ is determined for which the voltage reflection coefficient h at the input 142 of the model system 102 is zero, where Q is an integer greater than zero. The value ZloadQ is one of the values Zload and the value CoptimumQ is one of the values Coptimum. The processor 134 stores the table 720 in the memory device 137. The table 720 is an example of a relationship between the load impedance values Zload and the capacitance values Coptimum.

In some embodiments, instead of or in addition to creating the table 720, the processor 134 generates the polynomial (1) that is a relationship between the optimum combined variable capacitance values Coptimum and the load impedance values Zload. The combined variable capacitance values Coptimum is a function of the real part of Zload and the imaginary part of Zload, and the function is determined by fitting the function to the values Coptimum on the graph 600 (FIG. 6A). The function represented by the polynomial (1) is fitted by the processor 134.

Figure 8A:
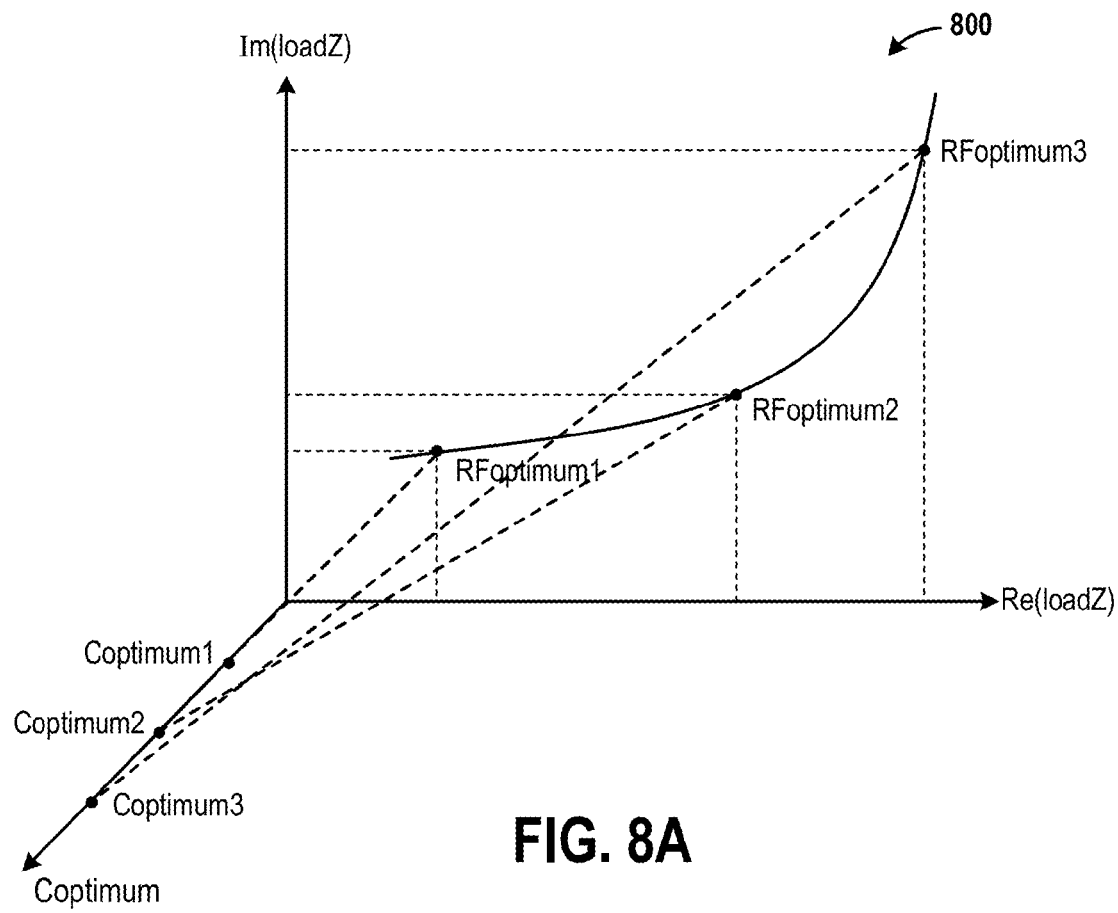
FIG. 8A is an embodiment of a graph to illustrate generation of optimum RF values from the optimum combined variable capacitance values Coptimum and from load impedance values Zload.

FIG. 8A is an embodiment of a graph 800 to illustrate generation of optimum RF values RFoptimum1, RFoptimum2, RFoptimum3, etc. from the optimum capacitance values Coptimum and from the load impedance values Zload. The graph 800 plots the real part of load impedance values Zload on the x-axis, the imaginary part of load impedance values Zload on the y-axis, and the optimum capacitance values Coptimum on a z-axis. The optimum capacitance value Coptimum1 and the load impedance value Zload1 correspond to the optimum RF value RFoptimum1. Moreover, the optimum capacitance value Coptimum2 and the load impedance value Zload2 correspond to the optimum RF value RFoptimum2, and the optimum capacitance value Coptimum3 and the load impedance value Zload3 correspond to the optimum RF value RFoptimum3.

Figure 8B:
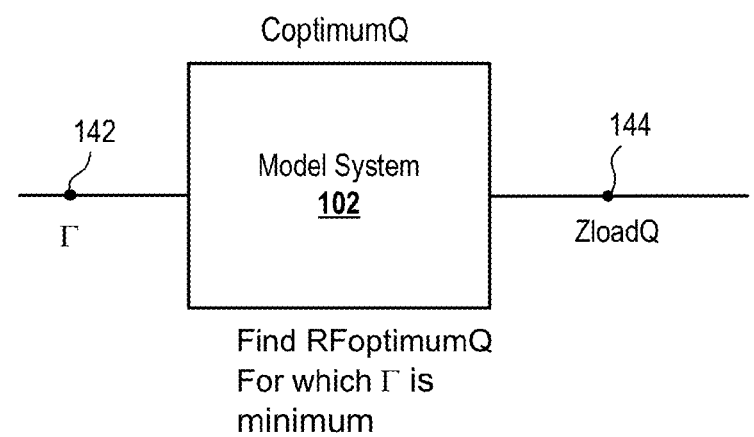
FIG. 8B is an embodiment of the model system to illustrate generation of an optimum RF value RFoptimumQ from an optimum combined variable capacitance value CoptimumQ and a load impedance value ZloadQ.

FIG. 8B is an embodiment of the model system 102 to illustrate generation of the optimum RF values RFoptimum from the optimum capacitance values Coptimum and the load impedance values Zload. The processor 134 applies the load impedance value ZloadQ at the output 144 of the model system 102 and initiates the model system 102 to have the value CoptimumQ, and further back propagates the value ZloadQ via the model system 102 to determine an optimum RF value RFoptimumQ for which the voltage reflection coefficient Γ at the input 142 of the model system 102 is minimum, e.g., non-zero, etc., where Q is an integer greater than zero. For example, the processor 134 back propagates the load impedance value Zload1 via the model system 102 that is initialized to have the value Coptimum1 to determine a first RF optimum value RFA for which the voltage reflection coefficient Γ at the input 142 of the model system 102 has a first value. Moreover, the processor 134 back propagates the load impedance value Zload1 via the model system 102 to determine a second RF optimum value RFB for which the voltage reflection coefficient Γ at the input 142 of the model system 102 has a second value. The processor 134 compares the first value with the second value to determine that the first value is a minimum between the two values, and further determines that the value RFA is one for which the voltage reflection coefficient Γ at the input 142 is minimum. The value RFA is an example of the value RFoptimum1. As another example, the processor 134 back propagates the load impedance value Zload2 via the model system 102 that is initialized to have the value Coptimum2 to determine a first RF optimum value RFC for which the voltage reflection coefficient Γ at the input 142 of the model system 102 has a first value. Moreover, the processor 134 back propagates the load impedance value Zload2 via the model system 102 to determine a second RF optimum value RFD for which the voltage reflection coefficient Γ at the input 142 of the model system 102 has a second value. The processor 134 compares the first value with the second value to determine that the first value is a minimum between the two values, and further determines that the RF value RFC is one for which the voltage reflection coefficient Γ at the input 142 is minimum. The value RFC is an example of the value RFoptimum2. The value RFoptimumQ is one of the values RFoptimum.

As yet another example, the processor 134 applies the load impedance value ZloadQ at the output 144 of the model system 102 and initiates the model system 102 to have the value CoptimumQ, and further back propagates the value ZloadQ via the model system 102 to determine an optimum RF value RFoptimumQ for which a value of a combination of a voltage reflection coefficient Γ1 for a state S1 of an RF signal generated by an RF generator and a voltage reflection coefficient Γ2 for a state S2 of the RF signal generated by an RF generator is minimum, e.g., non-zero value, a zero value, etc. An example of the combination of the voltage reflection coefficients is A*Γ1+B*Γ2, where A is a coefficient between 0 and 1 and B is another coefficient between 0 and 1. The coefficients A and B are provided by the user to the processor 132 via the input device. An example of B is (1-A). To illustrate, the processor 134 back propagates the load impedance value Zload1 via the model system 102 that is initialized to have the value Coptimum1 to determine the first RF optimum value RFA for which the combination of the voltage reflection coefficients Γ1 and Γ2 at the input 142 of the model system 102 has a first value. Moreover, the processor 134 back propagates the load impedance value Zload1 via the model system 102 to determine the second RF optimum value RFB for which the combination of the voltage reflection coefficients Γ1 and Γ2 at the input 142 of the model system 102 has a second value. The processor 134 compares the first value with the second value to determine that the first value is a minimum between the two values, and further determines that the value RFA is one for which the polynomial A*Γ1+(1−A)*Γ2 at the input 142 of the model system 102 is minimum. The value RFA is an example of the value RFoptimum1.

In some embodiments, instead of minimizing the voltage reflection coefficient Γ or the combination of the voltage reflection coefficients Γ1 and Γ2, another parameter, e.g., power reflection coefficient, etc., or a combination of parameters for the state S1 and S2 is minimized at the input 142.

In various embodiments, during the state S1, the RF signal generated by an RF generator has a power level, e.g., one or more power amounts, a root mean square power amount of the one or more power amounts, a power level of an envelope of an RF signal, etc., that is greater than a power level of the RF signal during the state S2. Similarly, during the state S1, the RF signal has a frequency level, e.g., one or more frequency amounts, a root mean square frequency amount of the one or more frequency amounts, etc., that is greater than a frequency level of the RF signal during the state S2. In these embodiments, the state S1 is referred to herein as a high state and the state S2 is referred to herein as a low state.

In some embodiments, during the state S2, the RF signal generated by an RF generator has a power level that is greater than a power level of the RF signal during the state S1. Similarly, in these embodiments, during the state S2, the RF signal has a frequency level, e.g., one or more frequency amounts, a root mean square frequency amount of the one or more frequency amounts, etc., that is greater than or less than a frequency level of the RF signal during the state S1. In these embodiments, the state S1 is referred to herein as a low state and the state S2 is referred to herein as a high state.

In various embodiments, during the state S2, the RF signal generated by an RF generator has a power level that is equal to a power level of the RF signal during the state S1.

In various embodiments, regardless of whether a power level of the RF signal generated by an RF generator during the state S2 is greater than or lower than a power level of the RF signal during the state S1, a frequency level of the RF signal during the state S2 is greater than or lower than a frequency level of the RF signal during the state S1.

In some embodiments, a level, e.g., a frequency level, a power level, etc., as used herein includes one or more values, and a level of a first state, e.g., the state S1, the state S2, etc., has values exclusive of values of a level of a second state, e.g., the state S1, the state S2, etc., that is different from the first state. For example, none of power values of an RF signal during the state S1 are the same as power values of the RF signal during the state S2. As another example, none of frequency values of an RF signal during the state S1 are the same as frequency values of the RF signal during the state S2.

Figures 8C, 9:
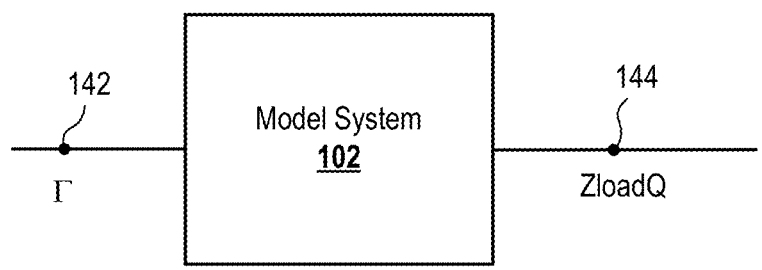
FIG. 8C is an embodiment of a table that includes a correspondence between the load impedance values Zload, the optimum capacitance values Coptimum, and multiple optimum radio frequency values RFoptimum.
FIG. 9 is a diagram of an embodiment of the model system to illustrate generation of the optimum RF value RFoptimumQ and the optimum combined variable capacitance value CoptimumQ for which a reflection coefficient at the input of the model system is zero.

FIG. 8C is an embodiment of a table 820 that includes a correspondence between the load impedance values Zload, the optimum capacitance values Coptimum, and optimum radio frequency values RFoptimum, which are determined by the processor 134 using the model system 102. For example, the processor 134 by applying the model system 102, as explained above with reference to FIG. 8B, determines that for the value ZloadQ and the capacitance value CoptimumQ, the value RFoptimumQ is determined for which the voltage reflection coefficient Γ at the input 142 of the model system 102 is minimum, where Q is the integer greater than zero. The processor 134 stores the table 820 in the memory device 137.

Other examples of tables generated by the processor 134 by applying the model system 102, as explained above with reference to FIG. 8B are provided below:

TABLE I

| Cap = Coptimum1 | Im(Zload) = X1 | Im(Zload) = X2 | Im(Zload) = X3 | Im(Zload) = X4 | Im(Zload) = X5 |
|---|---|---|---|---|---|
| Re(Zload) = R1 | RFoptimum 111 | RFoptimum 112 | RFoptimum 113 | RFoptimum 114 | RFoptimum 115 |
| Re(Zload) = R2 | RFoptimum 121 | RFoptimum 122 | RFoptimum 123 | RFoptimum 124 | RFoptimum 125 |
| Re(Zload) = R3 | RFoptimum 131 | RFoptimum 132 | RFoptimum 133 | RFoptimum 134 | RFoptimum 135 |
| Re(Zload) = R4 | RFoptimum 141 | RFoptimum 142 | RFoptimum 143 | RFoptimum 144 | RFoptimum 145 |
| Re(Zload) = R5 | RFoptimum 151 | RFoptimum 152 | RFoptimum 153 | RFoptimum 154 | RFoptimum 155 |

TABLE II

| Cap = Coptimum2 | Im(Zload) = X1 | Im(Zload) = X2 | Im(Zload) = X3 | Im(Zload) = X4 | Im(Zload) = X5 |
|---|---|---|---|---|---|
| Re(Zload) = R1 | RFoptimum 211 | RFoptimum 212 | RFoptimum 213 | RFoptimum 214 | RFoptimum 215 |
| Re(Zload) = R2 | RFoptimum 221 | RFoptimum 222 | RFoptimum 223 | RFoptimum 224 | RFoptimum 225 |
| Re(Zload) = R3 | RFoptimum 231 | RFoptimum 232 | RFoptimum 233 | RFoptimum 234 | RFoptimum 235 |
| Re(Zload) = R4 | RFoptimum 241 | RFoptimum 242 | RFoptimum 243 | RFoptimum 244 | RFoptimum 245 |
| Re(Zload) = R5 | RFoptimum 251 | RFoptimum 252 | RFoptimum 253 | RFoptimum 254 | RFoptimum 255 |

TABLE III

| Cap = Coptimum3 | Im(Zload) = X1 | Im(Zload) = X2 | Im(Zload) = X3 | Im(Zload) = X4 | Im(Zload) = X5 |
|---|---|---|---|---|---|
| Re(Zload) = R1 | RFoptimum 311 | RFoptimum 312 | RFoptimum 313 | RFoptimum 314 | RFoptimum 315 |
| Re(Zload) = R2 | RFoptimum 321 | RFoptimum 322 | RFoptimum 323 | RFoptimum 324 | RFoptimum 325 |
| Re(Zload) = R3 | RFoptimum 331 | RFoptimum 332 | RFoptimum 333 | RFoptimum 334 | RFoptimum 335 |
| Re(Zload) = R4 | RFoptimum 341 | RFoptimum 342 | RFoptimum 343 | RFoptimum 344 | RFoptimum 345 |
| Re(Zload) = R5 | RFoptimum 351 | RFoptimum 352 | RFoptimum 353 | RFoptimum 354 | RFoptimum 355 |

It should be noted that R1 through R5 are resistance values, and X1 thru X5 are reactance values. It should further be noted that the RFoptimum values in Table I are generated when the model system 102 is initialized to the optimum capacitance value Coptimum1. Moreover, the RFoptimum values in Table II are generated when the model system 102 is initialized to the optimum capacitance value Coptimum2. Also, the RFoptimum values in Table III are generated when the model system 102 is initialized to the optimum capacitance value Coptimum3.

For each value of load impedance ZloadQ and the optimum capacitance value Coptimum1, the processor 134 finds a row within the Table I to find a value of Re(Zload) and finds a column within the Table I to find a value of Im(Zload), and based on the values of Re(Zload) and Im(Zload), finds the optimum value RFoptimumQ. Similarly, for each value of load impedance ZloadQ and the optimum capacitance value Coptimum2, the processor 134 finds a row within the Table II to find a value of Re(Zload) and finds a column within the Table II to find a value of Im(Zload), and based on the values of Re(Zload) and Im(Zload), finds the optimum value RFoptimumQ. Also, for each value of load impedance ZloadQ and the optimum capacitance value Coptimum3, the processor 134 finds a row within the Table III to find a value of Re(Zload) and finds a column within the Table III to find a value of Im(Zload), and based on the values of Re(Zload) and Im(Zload), finds the optimum value RFoptimumQ.

In various embodiments, the expressions RFoptimumQ and RFoptimum are used interchangeably herein. Moreover, in these embodiments, the expressions ZloadQ and Zload are used interchangeably herein. Also, in these embodiments, the expressions Coptimum and CoptimumQ are used interchangeably herein.

In some embodiments, the look-up tables I, II, and III are approximated by the processor 134 to generate a polynomial RFoptimumQ=Function3(Re(Zload), Im(Zload), CoptimumQ), wherein Function3 is a function. For example, a best fit to the RFoptimumQ values, the values of Re(Zload) and Im(Zload), and the CoptimumQ values in Tables I through III are generated by the processor 134 to generate the polynomial RFoptimumQ=Function3(Re(Zload), Im(Zload), CoptimumQ). The look-up tables I through II, and the polynomial RFoptimumQ=Function3(Re(Zload), Im(Zload), CoptimumQ) are stored in the memory device 137.

FIG. 8C also shows an embodiment of a polynomial (2). Each of the table 820 and the polynomial (2) is an example of a relationship among the load impedance values Zload, the optimum capacitance values Coptimum, and the optimum radio frequency values RFoptimum. In some embodiments, instead of or in addition to creating the table 820, the processor 134 generates the polynomial (2). The RF values RFoptimum are a function of the combined variable capacitance values Coptimum, the real part of Zload values, and the imaginary part of Zload values, and the function is determined by fitting the function to the values RFoptimum on the graph 800 (FIG. 8A). The function represented by the polynomial (2) is fitted by the processor 134.

FIG. 9 is a block diagram of an embodiment of the model system 102 to illustrate generation of optimal values Coptimum and RFoptimum for which the voltage reflection coefficient at the input 142 of the model system 102 is zero. The voltage reflection coefficient Γ at the input 142 to the model system 102 depends on the load impedance values Zload, the optimum capacitance values Coptimum, e.g., a variable capacitor position, etc., and the RF frequency optimum values RFoptimum. For each value of load impedance ZloadQ, there is a single combination, determined by the processor 134, of the optimum capacitance value CoptimumQ and the RF frequency optimum value RFoptimumQ that yields Γ=0 at the input 142 of the model system 102. For example, the processor 134 applies the load impedance value ZloadQ at the output 144 of the model system 102, and further back propagates the value ZloadQ via the model system 102 to determine the optimum RF value RFoptimumQ and the optimum capacitance value CoptimumQ for which the voltage reflection coefficient Γ at the input 142 of the model system 102 is zero. The optimum capacitance value CoptimumQ and the RF frequency optimum value RFoptimumQ are sometimes referred to herein as tune values. Using the tune values, the impedance matching network 106 tunes the load impedance at the output 140 of the impedance matching network 106 so that the voltage reflection coefficient Γ at the input 128 of the impedance matching network 106 is zero, which is equivalent to an impedance at the input 128 of 50+0jΩ, where j is a complex number. Using the model system 102, the processor 134 pre-calculates or generates look-up tables or polynomial functions to find the tune values. Examples of the look-up tables are:

TABLE IV

|  | Im(Zload) = X1 | Im(Zload) = X2 | Im(Zload) = X3 | Im(Zload) = X4 | Im(Zload) = X5 |
| --- | --- | --- | --- | --- | --- |
| Re(Zload) = R1 | Coptimum 11 | Coptimum 12 | Coptimum 13 | Coptimum 14 | Coptimum 15 |
| Re(Zload) = R2 | Coptimum 21 | Coptimum 22 | Coptimum 23 | Coptimum 24 | Coptimum 25 |
| Re(Zload) = R3 | Coptimum 31 | Coptimum 32 | Coptimum 33 | Coptimum 34 | Coptimum 35 |
| Re(Zload) = R4 | Coptimum 41 | Coptimum 42 | Coptimum 43 | Coptimum 44 | Coptimum 45 |
| Re(Zload) = R5 | Coptimum 51 | Coptimum 52 | Coptimum 53 | Coptimum 54 | Coptimum 55 |

TABLE V

|  | Im(Zload) = X1 | Im(Zload) = X2 | Im(Zload) = X3 | Im(Zload) = X4 | Im(Zload) = X5 |
| --- | --- | --- | --- | --- | --- |
| Re(Zload) = R1 | RFoptimum 11 | RFoptimum 12 | RFoptimum 13 | RFoptimum 14 | RFoptimum 15 |
| Re(Zload) = R2 | RFoptimum 21 | RFoptimum 22 | RFoptimum 23 | RFoptimum 24 | RFoptimum 25 |
| Re(Zload) = R3 | RFoptimum 31 | RFoptimum 32 | RFoptimum 33 | RFoptimum 34 | RFoptimum 35 |
| Re(Zload) = R4 | RFoptimum 41 | RFoptimum 42 | RFoptimum 43 | RFoptimum 44 | RFoptimum 45 |
| Re(Zload) = R5 | RFoptimum 51 | RFoptimum 52 | RFoptimum 53 | RFoptimum 54 | RFoptimum 55 |

During plasma processing, for each value of load impedances Zload, the processor 134 finds a row within the Table IV to find a value of Re(Zload) and finds a column within the Table IV to find a value of Im(Zload), and based on the values of Re(Zload) and Im(Zload), finds the optimum capacitance value CoptimumQ, e.g., Coptimum11, or Coptimum12, or Coptimum13, or Coptimum14, or Coptimum15, or Coptimum21, or Coptimum22, or Coptimum23, or Coptimum24, or Coptimum25, or Coptimum31, or Coptimum32, or Coptimum33, or Coptimum34, or Coptimum35, or Coptimum41, or Coptimum42, or Coptimum43, or Coptimum44, or Coptimum45, or Coptimum51, or Coptimum52, or Coptimum53, or Coptimum54, or Coptimum55, etc. Similarly, for each value of the load impedances Zload, during plasma processing, the processor 134 finds a row within the Table V to find a value of Re(Zload) and finds a column within the Table V to find a value of Im(Zload), and based on the values of Re(Zload) and Im(Zload), finds the RF frequency optimum value RFoptimumQ e.g., RFoptimum11, or RFoptimum12, or RFoptimum13, or RFoptimum14, or RFoptimum15, or RFoptimum21, or RFoptimum22, or RFoptimum23, or RFoptimum24, or RFoptimum25, or RFoptimum31, or RFoptimum32, or RFoptimum33, or RFoptimum34, or RFoptimum35, or RFoptimum41, or RFoptimum42, or RFoptimum43, or RFoptimum44, or RFoptimum45, or RFoptimum51, or RFoptimum52, or RFoptimum53, or RFoptimum54, or RFoptimum55. It should be noted that for each CoptimumQ value in Table IV and for each RF optimum value RFoptimumQ in Table V, the voltage reflection coefficient at the input 142 of the match network model 102 is zero.

In some embodiments, the processor 134 approximates the look-up tables IV and V by generating polynomial functions:

$$Coptimum = Function1(Re(Zload), Im(Zload)) \quad \text{equation (3)}$$

$$RFoptimum = Function2(Re(Zload), Im(Zload)) \quad \text{equation (4)},$$

where Function1 is a function of Re(Zload) and Im(Zload), and Function 2 is a function of Re(Zload) and Im(Zload). For example, a best fit to the values of Re(Zload) and Im(Zload), and the Coptimum values in Table IV is generated by the processor 134 to generate the polynomial equation (3). As another example, a best fit to the RFoptimum values, and the values of Re(Zload) and Im(Zload) in Table V is generated by the processor 134 to generate the equation (4). The look-up tables IV and V, and the equations (3) and (4) are stored in the memory device 137.

Figure 10:
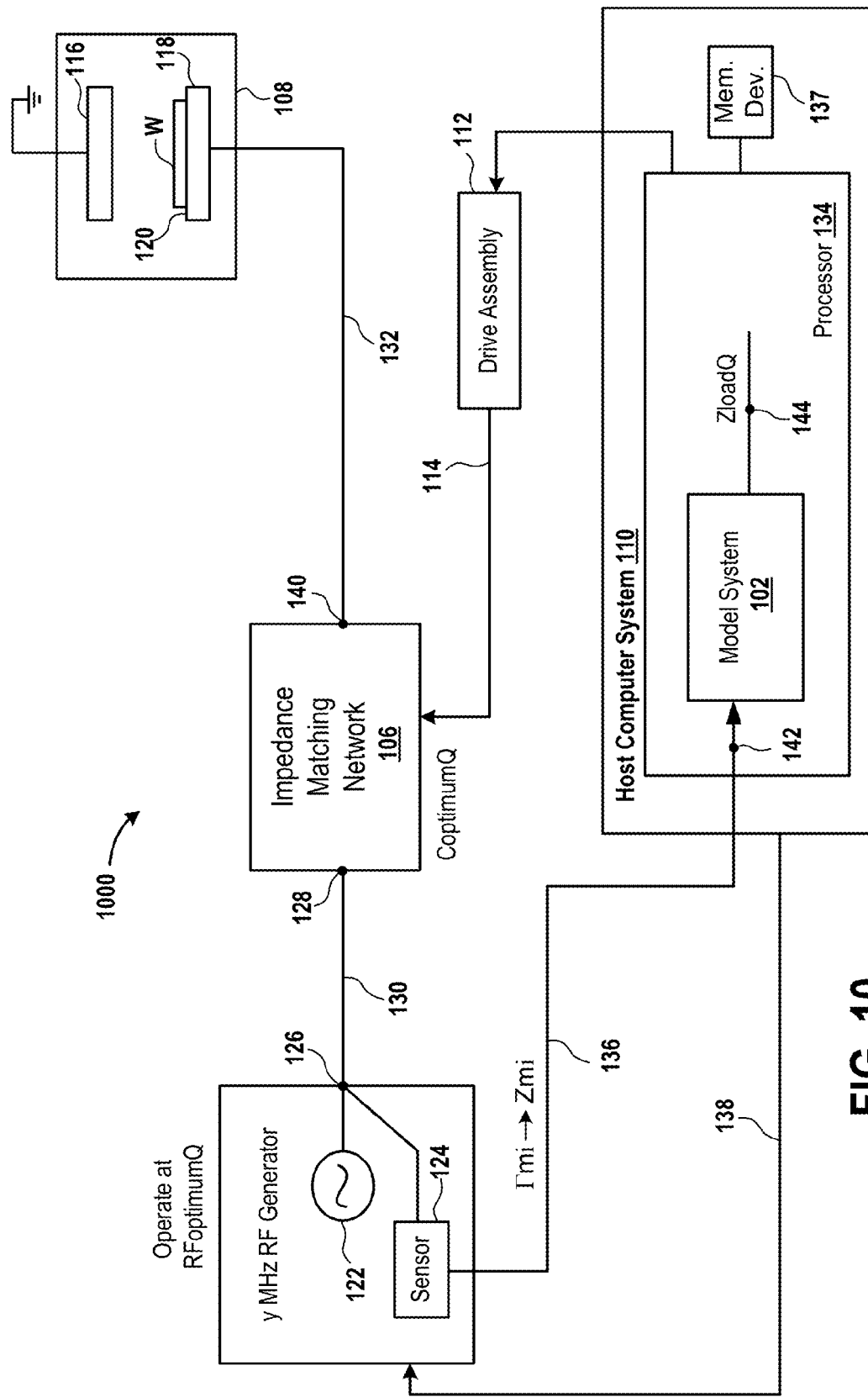
FIG. 10 is a block diagram of an embodiment of the plasma system to illustrate application of the optimum values RFoptimumQ and CoptimumQ based on the load impedance value ZloadQ.

FIG. 10 is a block diagram of an embodiment of a plasma system 1000 to illustrate application of the optimum values RFoptimum and Coptimum based on the load impedance values Zload. The plasma system 1000 includes the y MHz RF generator. In some embodiments, the y MHz RF generator is a 400 kHz RF generator, or a 2 MHz RF generator, or a 27 MHz RF generator, or a 60 MHz RF generator. During processing of the wafer W in the plasma chamber 108, the sensor 124 measures an amount of voltage reflection coefficient Γmi at the output 126 of the y MHz RF generator. The processor 134 receives the voltage reflection coefficient Γmi via the network cable 136 and converts the voltage reflection coefficient Γmi into an impedance value Zmi by applying the equation (1).

The processor 134 applies the impedance value Zmi at the input 142, and forward propagates the impedance value Zmi via the model system 102 to generate the load impedance value ZloadQ at the output 144 in a manner similar to generating the load impedance values ZL(P1)n from the values Zmi(P1)n (FIG. 1). The processor 134 accesses a table A, e.g., the table I, or the table II, or the table III, or the tables IV and V, or the table 820, etc., from the memory device 137, and determines from the table A the value CoptimumQ and the value RFoptimumQ that correspond to the value ZloadQ. To illustrate, when the load impedance at the output 144 of the model system 102 is determined to be Zload1, the processor 134 accesses the table A from the memory device 137, and determines from the table A the value Coptimum1 and the value RFoptimum1 that correspond to the value Zload1. As another illustration, when the load impedance at the output 144 of the model system 102 is determined to be Zload2, the processor 134 accesses the table A from the memory device 137, and determines from the table A the value Coptimum2 and the value RFoptimum2 that correspond to the value Zload2. As yet another illustration, when a capacitance of the impedance matching network 106 and of the model system 102 is set to Coptimum1, and when a resistance of the load impedance at the output 144 of the model system 102 is determined to be R1 and a reactance of the load impedance is determined to be X1, the processor 134 determines from the table I that the value RFoptimum111 corresponds to the values R1 and X1. As another illustration, when a resistance of the load impedance at the output 144 of the model system 102 is determined to be R1 and a reactance of the load impedance is determined to be X1, the processor 134 determines from the table IV that the value Coptimum11 corresponds to the values R1 and X1. Moreover, in this illustration, the processor 134 determines from the table V that the value RFoptimum11 corresponds to the values R1 and X1.

As another example, the processor 134 applies the polynomial (1) to the value ZloadQ to calculate the value CoptimumQ, and applies the polynomial (2) to the values ZloadQ and CoptimumQ to determine the value RFoptimumQ. To illustrate, the processor 134 applies the polynomial (1) to the value Zload1 to calculate the value Coptimum1, and applies the polynomial (2) to the values Zload1 and Coptimum1 to determine the value RFoptimum1. As another illustration, the processor 134 applies the polynomial (1) to the value Zload2 to calculate the value Coptimum2, and applies the polynomial (2) to the values Zload2 and Coptimum2 to determine the value RFoptimum2. As yet another example, the processor 134 accesses the polynomial RFoptimumQ=Function3(Re(Zload), Im(Zload), CoptimumQ) from the memory device 137, and applies the polynomial to the values R1 and X1 and Coptimum1 to generate the value RFoptimum111. In this example, a capacitance of the impedance matching network 106 and of the model system 102 is set to Coptimum1. As another example, the processor 134 accesses the equation (3) from the memory device 137, and applies the equation (3) to the values R1 and X1 to determine the value Coptimum1. Moreover, in this example, the processor 134 accesses the equation (4) from the memory device 137, and applies the equation (4) to the values R1 and X1 to determine the value RFoptimum1. As another example, the processor 134 determines whether the RF signal generated by the y MHz RF generator is a multiple state signal. For example, it is specified in a recipe that is provided to the processor 134 that the RF signal is to have the two states S1 and S2. In this example, a capacitance of the impedance matching network 106 and of the model system 102 is set to Coptimum1. The processor 134 has pre-determined that for the value Coptimum1, to minimize the combination of the voltage reflection coefficient polynomial Γ1 for the state S1 of the RF signal generated by the y MHz RF generator and the voltage reflection coefficient polynomial Γ2 for the state S2 of the RF signal, the optimum RF value RFoptimumQ is to be provided to the y MHz RF generator.

The processor 134 modifies the recipe to include the value RFoptimumQ in the recipe and sends the recipe to the y MHz RF generator via the network cable 138. Upon receiving the value RFoptimumQ, the DSP of the y MHz RF generator controls the RF power supply 122 to generate the RF signal having the frequency value RFoptimumQ or within a pre-determined range of the frequency value RFoptimumQ. The RF power supply 122, upon receiving a signal indicating that the RF signal having the frequency value RFoptimumQ or within a pre-determined range of the frequency value RFoptimumQ is to be generated, generates the RF signal, and sends the RF signal via the RF cable 130 to the input 128 of the impedance matching network 106.

Moreover, in some embodiments in which a combined variable capacitance of the impedance matching network 106 is to be changed, the processor 134 sends a signal representing the value CoptimumQ to the driver of the drive assembly 112 to generate one or more current signals. For example, when the tables I, II, or III, or the polynomial RFoptimumQ=Function3(Re(Zload), Im(Zload), CoptimumQ) are applied, the impedance matching network 106 and the model system 102 are set to the value CoptimumQ, from which RFoptimumQ is determined, and there is no need to achieve the value CoptimumQ. In this example, the value ZloadQ is determined when the model system 102 is initialized to have the optimum value CoptimumQ. As another example, when the tables IV and V or the equations (3) and (4) are applied, the impedance matching network 106 and the model system 102 are not set to the value CoptimumQ and are set to another combined variable capacitance value. The other combined variable capacitance is adjusted to achieve the value CoptimumQ.

The one or more current signals are generated by the driver based on the capacitance value CoptimumQ and sent to corresponding one or more stators of corresponding one or more motors of the drive assembly 112. The one or more rotors of the drive assembly 112 that are in electrical field contact with the corresponding one or more stators rotate to move the connection mechanism 114 to change the combined variable capacitance of the branch circuit of the impedance matching network 106 to CoptimumQ. The branch circuit of the impedance matching network 106 having the combined variable capacitance CoptimumQ receives the RF signal having the radio frequency value RFoptimumQ from the output 126 via the input 128 and the RF cable 130 and matches an impedance of the load connected to the impedance matching network 106 with that of a source connected to the impedance matching network 106 to generate the modified signal. Examples of the source include the y MHz RF generator and the RF cable 130. The modified signal is provided from the output 140 of the branch circuit of the impedance matching network 106 via the RF transmission line 132 to the chuck 118. When the modified signal is provided to the chuck 118 in conjunction with one or more process gases, plasma is produced or is maintained in the gap between the chuck 118 and the upper electrode 116 for processing the wafer W.

The generation of the values RFoptimumQ and CoptimumQ by using the table A, e.g., the table I, or the table II, or the table III, or the tables IV and V, or the table 820, etc., or a polynomial A, e.g., the polynomial (2), or the polynomial RFoptimumQ=Function3(Re(Zload), Im(Zload), CoptimumQ), or the equations (3) and (4), etc., increases speed of operation of the plasma system 1000 for processing the wafer W. For example, there is no need to use the model system 102 to determine the values RFoptimumQ and CoptimumQ after the measurement of the voltage reflection coefficient Γmi by the sensor 124. Rather, the values RFoptimumQ and CoptimumQ are pre-stored in the table A and/or the polynomial A is generated before the measurement of the voltage reflection coefficient Γmi by the sensor 124. Once the voltage reflection coefficient Γmi is measured by the sensor 124, the values RFoptimumQ and CoptimumQ are accessed by the processor 134 from the table A and/or calculated by the processor 134 by applying the polynomial A. The lack of use of the model system 102 for calculating the values RFoptimumQ and CoptimumQ after the measurement of the voltage reflection coefficient Γmi saves time during processing of the wafer W. Moreover, the application of the values RFoptimumQ and CoptimumQ to the plasma system 1000 reduces power that is reflected towards the y MHz RF generator to improve efficiency in processing the wafer W.

In some embodiments, any of the values RFoptimumQ or the values CoptimumQ lie outside a physically accessible space. For example, a frequency tuning range of the 60 MHz RF generator is from 57.00 MHz to 63.00 MHz, and the value RFoptimum1 as determined from the model system 102 is lower than 57 MHz or higher than 63 MHz. In such a case, an optimum operating condition is on a boundary of a constrained space that is closest in terms of a scaled distance to an out-of-bounds solution, e.g., RFoptimumQ, CoptimumQ, etc. An example of the scaled distance=[(capacitor position)−(CoptimumQ)]^2+k^2*[(RF frequency)−(RFoptimumQ)]^2, where k is a pre-defined value that is provided as an input to the processor 134 via the input device.

In various embodiments, each of the measured voltage reflection coefficients Γmi is weighted by the processor 134 according to a pre-assigned weight. The weights applied by the processor 134 to the voltage reflection coefficients Γmi are received as inputs via the input device by the processor 134 and are determined based on the engineering knowledge and/or the process conditions. Instead of applying the voltage reflection coefficients Γmi, the weighted voltage reflection coefficients wΓmin are applied to the model system 102 to determine the load impedances ZloadQ, where each w is the pre-assigned weight.

Figure 11:
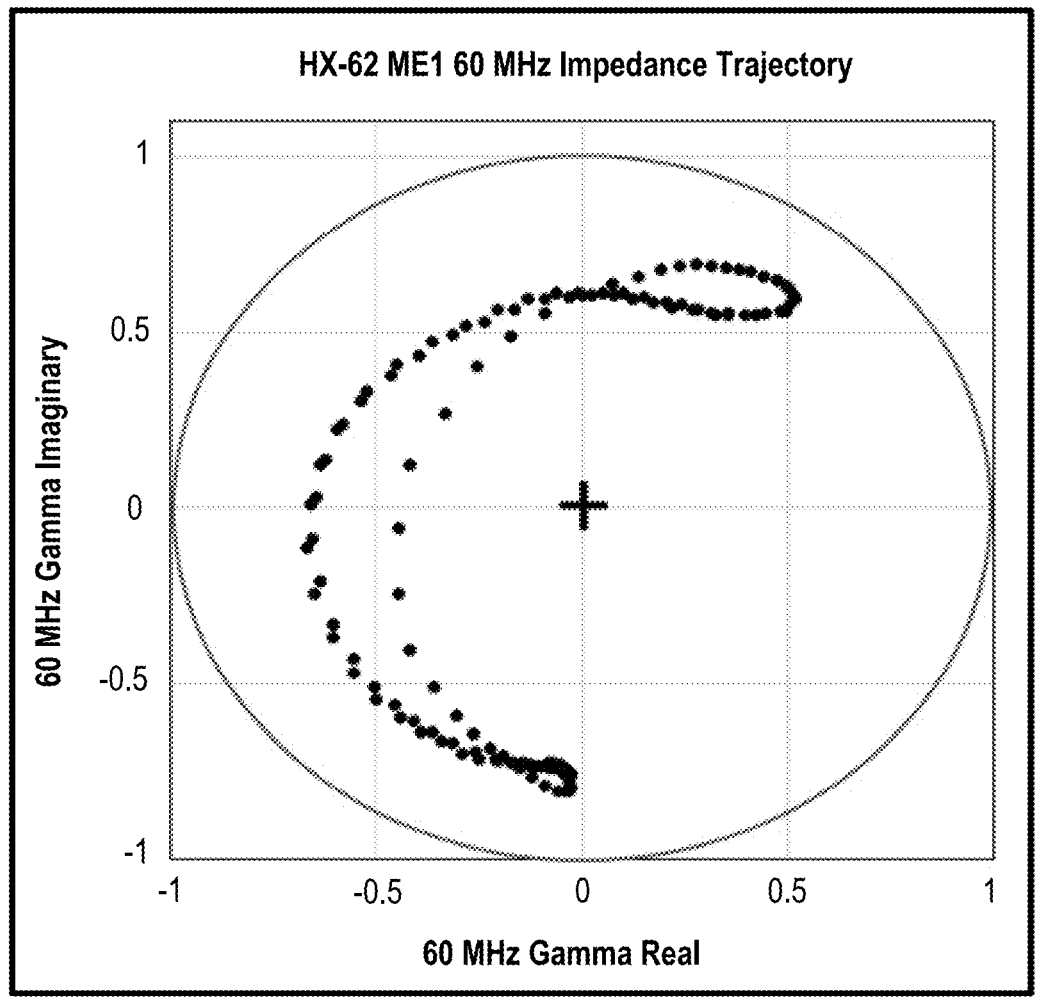
FIG. 11 is an embodiment of a graph to illustrate a variation in an input impedance of an impedance matching network when the y MHz RF generator is a 60 MHz RF generator.

FIG. 11 is an embodiment of a graph 1100 to illustrate a variation in an input impedance of the impedance matching network 106 at the input 128 when the y MHz RF generator is a 60 MHz RF generator. Real and imaginary parts of gamma are calculated from the input impedance and are shown as varying with time due to an effect of the RF signal that is generated by the x MHz RF generator. The graph 1100 plots the real part of gamma on the x-axis and the imaginary part of gamma on the y-axis. A pattern of the real and imaginary parts of gamma is formed as shown in the graph 1100. As shown in the graph 1100, a complete cycle of the pattern takes one period of the x MHz RF generator or about 2.5 microseconds. In some embodiments, the complete cycle takes more or less than 2.5 microseconds, e.g., 2 microseconds, 3 microseconds, a range between 2.5 and 4 microseconds, a range between 1 and 2.5 microseconds, etc.

Figure 12:
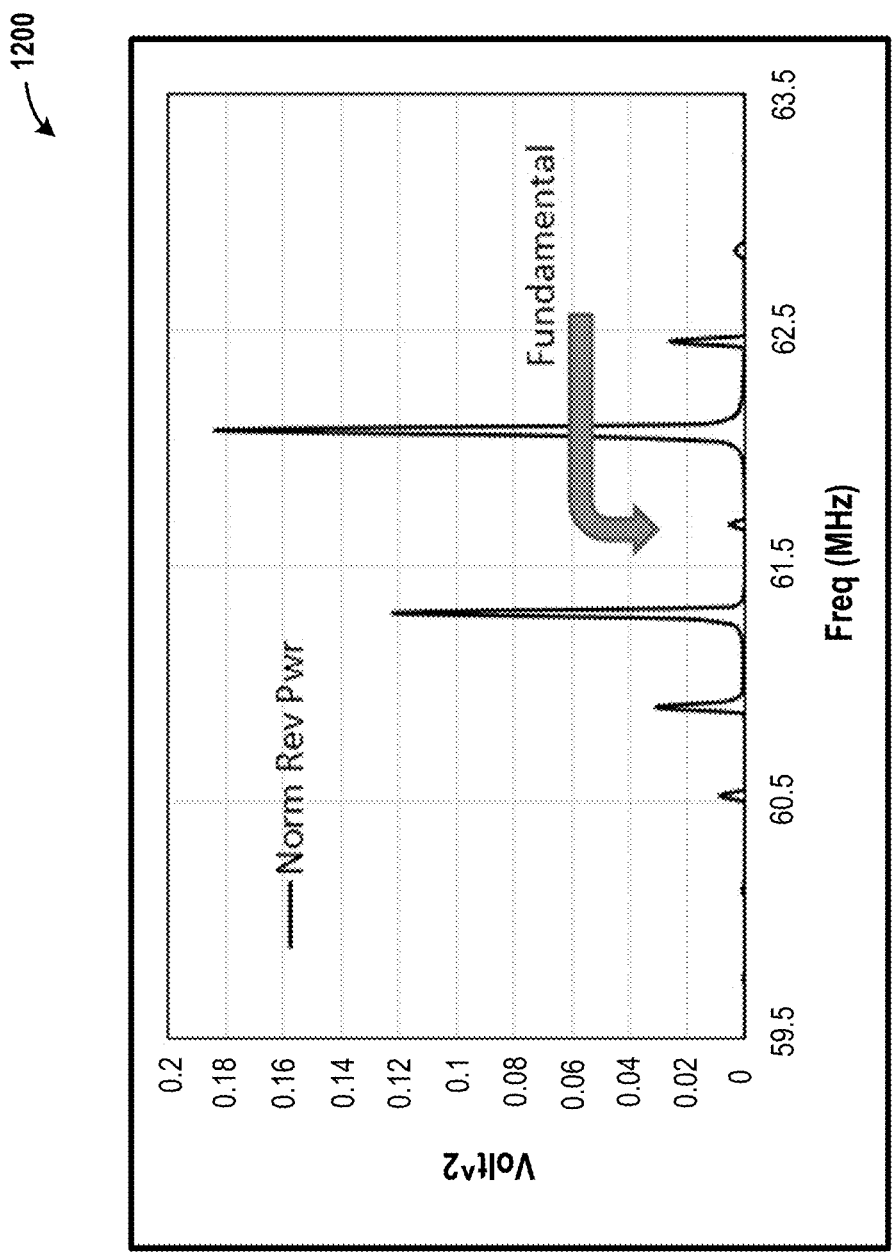
FIG. 12 is an embodiment of a graph to illustrate a Fourier transform of a voltage reflected towards the y MHz RF generator when the y MHz RF generator is a 60 MHz RF generator.

FIG. 12 is an embodiment of a graph 1200 to illustrate a Fourier transform of a voltage reflected towards the y MHz RF generator when the y MHz RF generator is a 60 MHz RF generator, expressed as fractions of forward power supplied by the y MHz RF generator. The graph 1200 plots a square of voltage versus frequency of the RF signal generated by the y MHz RF generator. The square of voltage is a measure of power reflected towards the y MHz RF generator. In some embodiments, the reflected power at the fundamental frequency of the RF signal generated by the y MHz RF signal is filtered by the systems and methods described herein. A small reflected power peak in the Fourier spectrum of the graph 1100 at the fundamental frequency is illustrated in the graph 1200. Moreover, there are large reflected power peaks at intermodulated frequencies of 60 MHz±400 kHz, etc. The systems and methods described herein apply the model system 102 to reduce power reflected towards the y MHz RF generator at various frequencies, e.g., intermodulated frequencies of y MHz±x MHz, intermodulated frequencies of 60 MHz±400 kHz, fundamental frequency, etc. The systems and methods described herein find optimum combined variable capacitance and radio frequency values for minimum overall reflected power, not only at the fundamental frequency but also at other frequencies, e.g., intermodulated frequencies of y MHz±x MHz.

To reduce the power reflected, in some embodiments, forward and reflected waveform data for the y MHz RF generator is collected at a rate to capture a change within one period of the x MHz RF generator. For example, such collection is done in at least 2.5 microseconds at a rate of at least 1 Giga samples per second. The collected data is then analyzed in segments, e.g., 0.1 microsecond windows to break the 2.5 microseconds of the x MHz period into 25 separate impedance measurements. Illustrated in FIG. 11 are results of analyzing 0.1 microsecond sections of waveform, with a time difference between sections of 0.03 microseconds, so there is some overlap between points. Then, an average of the power reflection coefficient, e.g., $|\Gamma|^2$, etc., is calculated to get an average power reflected towards the y MHz RF generator, calculated over one period of x MHz. The combined variable capacitance and RF frequency are varied by the processor 134 in the model system 102 and it is recorded by the processor 134 in the memory device 137 how a power reflection coefficient changes for each of the 25 impedance measurements. Then, values of capacitor position of the combined variable capacitance of the impedance matching network 106 and/or RF frequency of the y MHz RF generator that minimize the overall, e.g., average, etc., power reflection coefficient are determined by the processor 134. In various embodiments, the total calculation time will be longer than 2.5 microseconds, but an improvement of power delivery on a time scale of perhaps a few milliseconds is achieved. By using the model system 102, the y MHz RF generator is tuned to an RF frequency to achieve a minimum average of the power reflection coefficient $|\Gamma|^2$, averaged over a period of the x MHz RF frequency. The same capacitor value of the combined variable capacitance and RF frequency is used for one period of the RF signal generated by the x MHz RF generator.

In some embodiments, a frequency of the RF signal generated by the y MHz RF generator is tuned within a single RF cycle of the RF signal generated by the x MHz RF generator. For example, an RF cycle, e.g., the 2.5 microsecond period, etc., of the RF signal generated by the x MHz RF generator is segmented into, e.g., 5 sections of 0.5 microseconds each. A different y MHz RF frequency is applied during each of the segments, and each of the different frequencies is an optimum frequency determined using the model system 102 for an optimum value of the combined variable capacitance of the model system 102. As another example, a 2.5 microsecond duration of a period of the RF signal generated by the x MHz RF generator is segmented into 4 sections of 0.625 microseconds each, and a different frequency of the RF signal generated by the y MHz RF generator is determined during each of the 4 sections. The frequencies are determined from the model system 102 to minimize a reflected power coefficient at the output 126 of the y MHz RF generator or the input 128 (FIG. 1) during each section. As yet another example, the RF frequency of the RF signal generated by the y MHz RF generator is modulated at x MHz by some simple function, such as, e.g., a sine wave, a cosine wave, etc. The 25 initial measurements obtained at the output 126 of the y MHz RF generator are obtained by the processor 134 to calculate an amplitude and phase of the frequency modulation to reduce a cycle-averaged power reflection coefficient. In several embodiments, frequencies of the y MHz RF generator are adjusted in microsecond, sub-microsecond, or millisecond time scales.

In some embodiments, the RF signals generated by the x MHz RF generator and the y MHz RF generator have multiple states. For example, the x MHz RF generator has states S1 and S2 of operation and so does the y MHz RF generator. A power level of an RF signal generated by an RF generator during the state S1 is greater than a power level of an RF signal generated by the RF generator during the state S2. For example, an envelope of power amounts of an RF signal generated by an RF generator during the state S1 has a greater power level than an envelope of power amounts of the RF signal during the state S2.

In various embodiments, the RF signals generated by the x MHz RF generator and the y MHz RF generator are continuous. For example, each of the x and y MHz RF generators have a single state.

It should be noted that in some of the above-described embodiments, an RF signal is supplied to the lower electrode of the chuck 118 and the upper electrode 116 is grounded. In various embodiments, an RF signal is applied to the upper electrode 116 and the lower electrode of the chuck 118 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber. Examples of a shape of the inductor include a solenoid, a dome-shaped coil, a flat-shaped coil, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for reducing power reflected towards a radio frequency (RF) generator, comprising:
receiving during a first RF cycle of a first RF generator a first plurality of measured input parameter values sensed between an output of a second RF generator and an input of an impedance matching network when the second RF generator operates at a first plurality of radio frequency values and the impedance matching network has a first variable measurable factor;
initializing for the first RF cycle one or more computer-generated models to have the first variable measurable factor and the first plurality of radio frequency values, wherein the one or more computer-generated models include a model of the impedance matching network;

determining for the first RF cycle a first plurality of output parameter values using the one or more computer-generated models from the first plurality of measured input parameter values when the one or more computer-generated models have the first variable measurable factor and the first plurality of radio frequency values;

generating, using the first plurality of output parameter values and the one or more computer-generated models, a first plurality of favorable radio frequency values, wherein for each of the first plurality of favorable radio frequency values, a reflection coefficient for the first RF cycle at an input of the one or more computer-generated models is minimum; and operating, during a second RF cycle of the first RF generator, the second RF generator at the first plurality of favorable radio frequency values to reduce the power reflected towards the second RF generator.

2. The method of claim 1, further comprising:

receiving during the second RF cycle of the first RF generator a second plurality of measured input parameter values sensed between the output of the second RF generator and the input of the impedance matching network when the second RF generator operates at the first plurality of favorable radio frequency values;

initializing for the second RF cycle the one or more computer-generated models of the impedance matching network to have the first plurality of favorable radio frequency values;

calculating for the second RF cycle a second plurality of output parameter values using the one or more computer-generated models from the second plurality of measured input parameter values when the one or more computer-generated models has the first plurality of favorable radio frequency values;

calculating, using the second plurality of output parameter values and the one or more computer-generated models, a second plurality of favorable radio frequency values, wherein for each of the second plurality of favorable radio frequency values, a reflection coefficient for the second RF cycle at the input of the one or more computer-generated models is minimum;

controlling, during a third RF cycle of the first RF generator, the second RF generator to operate at the second plurality of favorable radio frequency values.

3. The method of claim 2, wherein the third RF cycle is consecutive to the second RF cycle.

4. The method of claim 2, wherein the third RF cycle follows the second RF cycle after one or more intermediate RF cycles between the second RF cycle and the third RF cycle.

5. The method of claim 1, wherein the second RF cycle is consecutive to the first RF cycle.

6. The method of claim 1, wherein the second RF cycle follows the first RF cycle after one or more intermediate RF cycles between the first RF cycle and the second RF cycle.

7. The method of claim 1, further comprising calculating, using the first plurality of output parameter values and the one or more computer-generated models, an optimum variable capacitance value for which a weighted reflection coefficient at the input of the one or more computer-generated models is minimum.

8. The method of claim 1, further comprising weighting the first plurality of measured input parameter values.

9. A method for reducing power reflected towards a radio frequency (RF) generator, comprising:

receiving a plurality of load impedance values, wherein each of the plurality of load impedance values is associated with a different process condition;

applying the plurality of load impedance values to one or more computer-generated models to generate a plurality of optimum variable capacitance values for which a reflection coefficient at an input of the one or more computer-generated models is zero, wherein the one or more computer-generated models include a computer-generated model of an impedance matching network;

generating a first relationship between the plurality of optimum variable capacitance values and the plurality of load impedance values;

applying the plurality of load impedance values and the plurality of optimum variable capacitance values to the one or more computer-generated models to determine a plurality of optimum RF values, wherein for each of the plurality of optimum RF values, the reflection coefficient at the input of the one or more computer-generated models is minimum;

generating a second relationship between the plurality of load impedance values, the plurality of optimum variable capacitance values, and the plurality of optimum RF values;

determining one of the plurality of load impedance values during plasma processing, wherein the one of the plurality of load impedance values is calculated from a parameter value measured at an output of the RF generator;

determining one of the plurality of optimum variable capacitance values and one of the plurality of optimum RF values from the second relationship;

operating the RF generator at the one of the plurality of optimum RF values during the plasma processing; and controlling the impedance matching network to have the one of the plurality of optimum variable capacitance values during the plasma processing, wherein said operating the RF generator at the one of the plurality of optimum RF values and said controlling the impedance matching network to have the one of the plurality of optimum variable capacitance values are performed during the plasma processing to reduce the power reflected towards the RF generator.

10. The method of claim 9, wherein the first relationship is a table, wherein the second relationship is a table.

11. The method of claim 9, wherein the first relationship is a polynomial, wherein the second relationship is a polynomial.

12. The method of claim 11, wherein the one or more computer-generated models include a computer-generated model of an RF transmission line connecting the impedance matching network with a plasma chamber, and a computer-generated model of an RF cable connecting the impedance matching network to the RF generator.

13. A method for reducing power reflected towards a radio frequency (RF) generator, comprising:

receiving a plurality of load impedance values, wherein each of the load impedance values is associated with a different process condition;

applying the plurality of load impedance values to one or more computer-generated models to generate a plurality of optimum radio frequency values for which a reflection coefficient at an input of the one or more computer-generated models is optimized, wherein the one or more computer-generated models include a computer-generated model of an impedance matching network;

generating a relationship between the plurality of optimum radio frequency values and the plurality of load impedance values;

calculating one of the plurality of load impedance values during plasma processing, wherein the one of the plurality of load impedance values is calculated from a value measured at an output of the RF generator;

determining one of the plurality of optimum radio frequency values from the relationship and the one of the plurality of load impedance values; and controlling the RF generator to operate at the one of the plurality of optimum radio frequency values during the plasma processing to reduce the power reflected towards the RF generator.

14. The method of claim 13, further comprising controlling the RF generator to operate at another one of the plurality of optimum radio frequency values during the plasma processing.

15. The method of claim 13, wherein the plurality of optimum radio frequency values are determined when the one or more computer-generated models are initialized to have an optimum capacitance value.

16. The method of claim 13, further comprising determining an optimum capacitance value from the relationship and the one of the plurality of load impedance values.

17. The method of claim 13, wherein the relationship is a polynomial.

18. The method of claim 13, wherein the reflection coefficient is a voltage reflection coefficient, wherein the voltage reflection coefficient is optimized when the voltage reflection coefficient is zero or has a minimum value.

* * * * *